United States Patent [19]

Hynecek

[11] Patent Number: 4,660,090
[45] Date of Patent: Apr. 21, 1987

[54] CCD IMAGER WITH ON-CHIP PROCESSING

[75] Inventor: Jaroslav Hynecek, Richardson, Tex.

[73] Assignee: Texas Instruments Incorporated, Dallas, Tex.

[21] Appl. No.: 770,326

[22] Filed: Aug. 27, 1985

[51] Int. Cl.[4] .............................................. H04N 5/30
[52] U.S. Cl. ...................................... 358/213; 357/24
[58] Field of Search .......................... 358/213; 377/60; 357/24 LR

[56] References Cited

U.S. PATENT DOCUMENTS 4,496,982 1/1985 Levine ................................. 358/213
4,556,851 12/1985 Levine ................................. 358/213

Primary Examiner—Gene Z. Rubinson
Assistant Examiner—Stephen Brinich
Attorney, Agent, or Firm—Richard A. Bachand; N. Rhys Merrett; Melvin Sharp

[57] ABSTRACT

A CCD imager with a correlated clamp sample and hold amplifier on chip includes a chain of CCD wells, a charge-sensing node coupled to one end of the chain of CCD wells, and a clock to clock charge packets from the chain of CCD wells into the charge-sensing node. A dummy charge-sensing node is integrated into the same monocrystalline semiconductor substrate as the charge-sensing node, and the charge-sensing node and the dummy node are connected to a common reference voltage. An amplifier senses a predetermined voltage change on the charge-sensing node with reference to the voltage on the dummy node after a charge packet has been transferred into the charge-sensing node.

6 Claims, 29 Drawing Figures

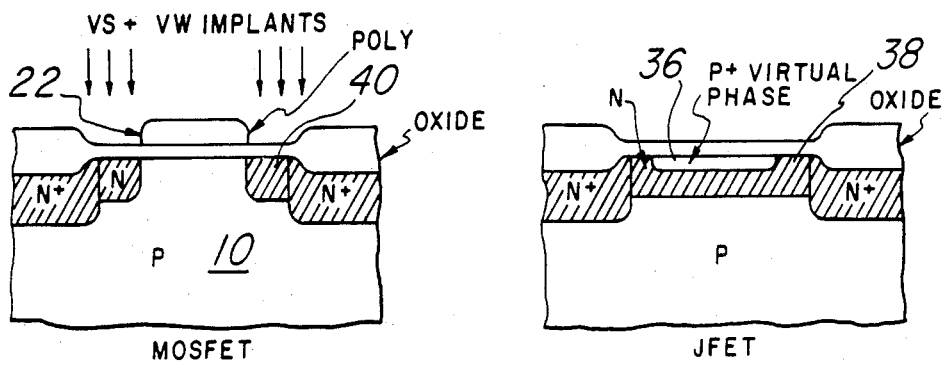
Fig. 10a
Fig. 10b
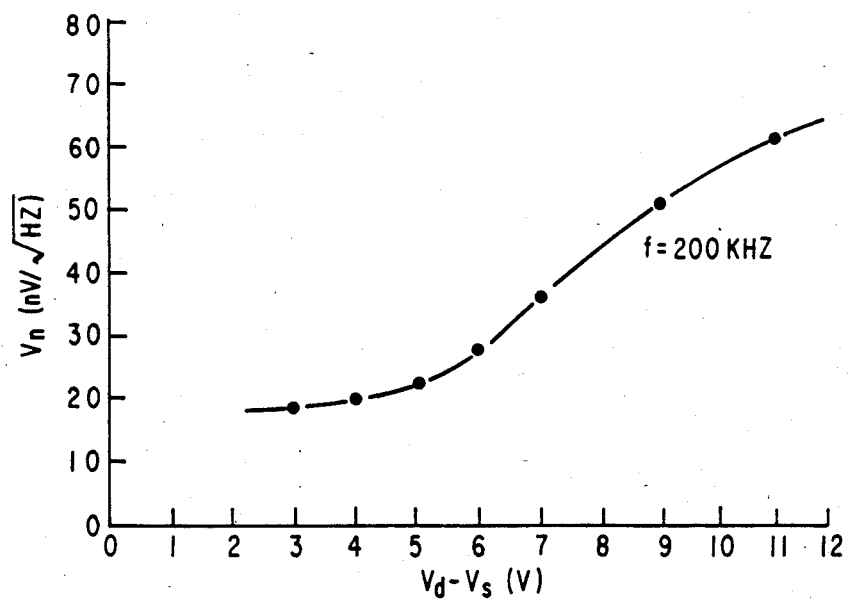
Fig. 11

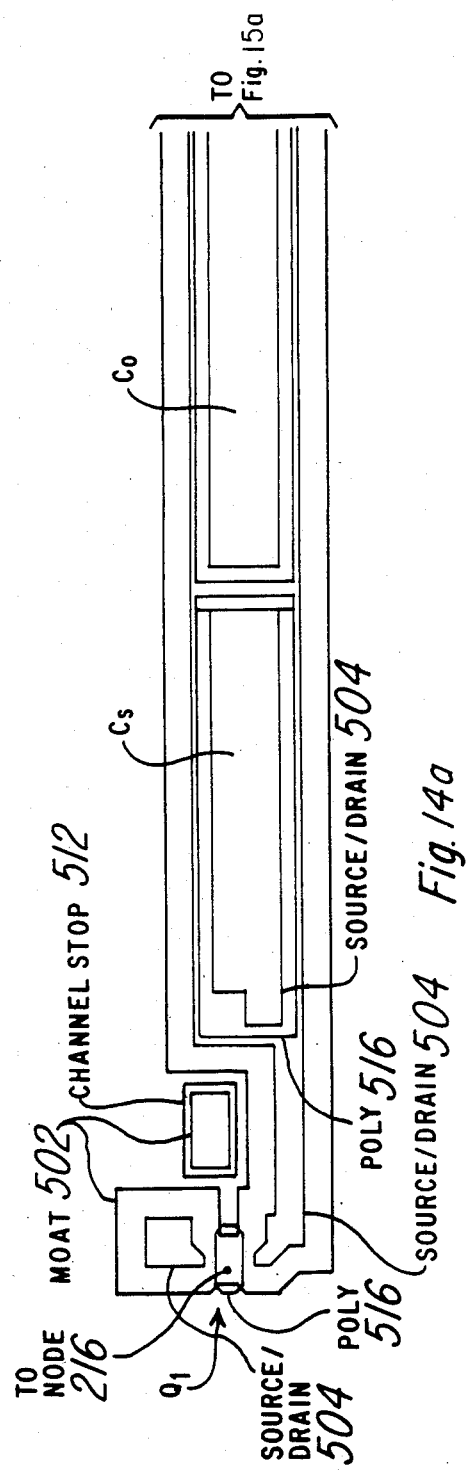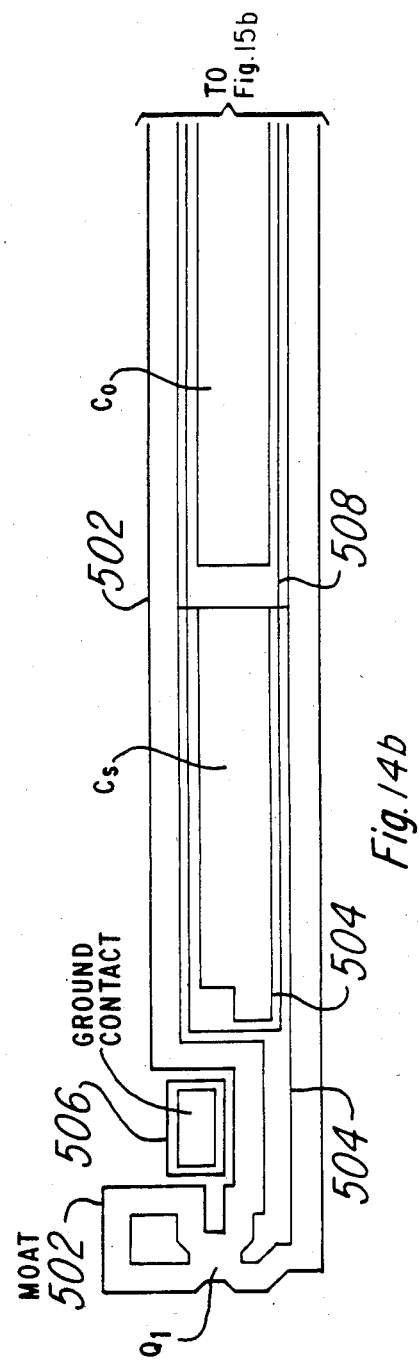

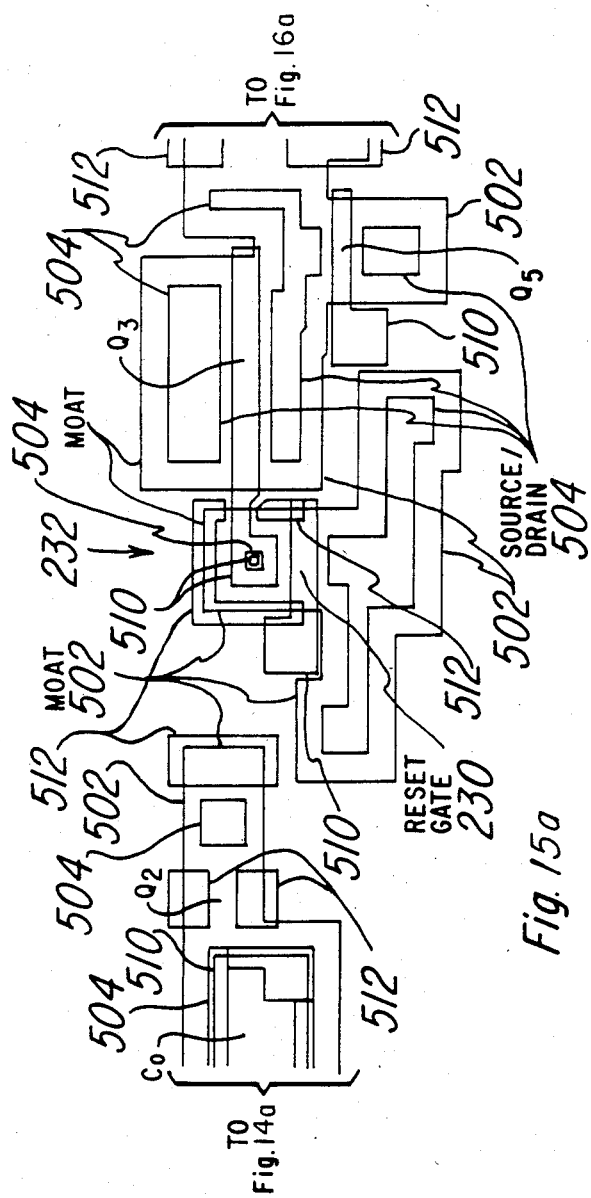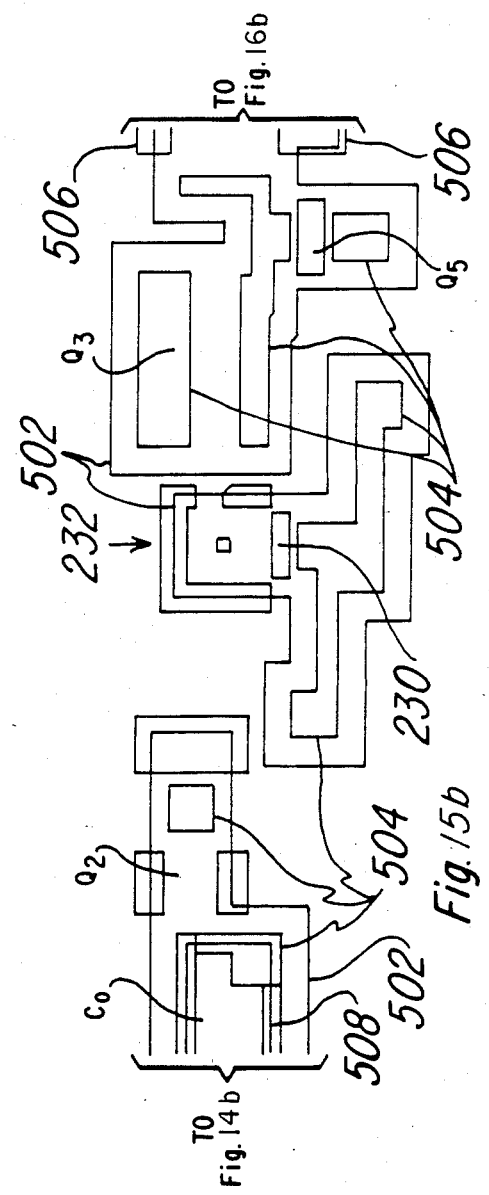
Fig. 15a
Fig. 15b

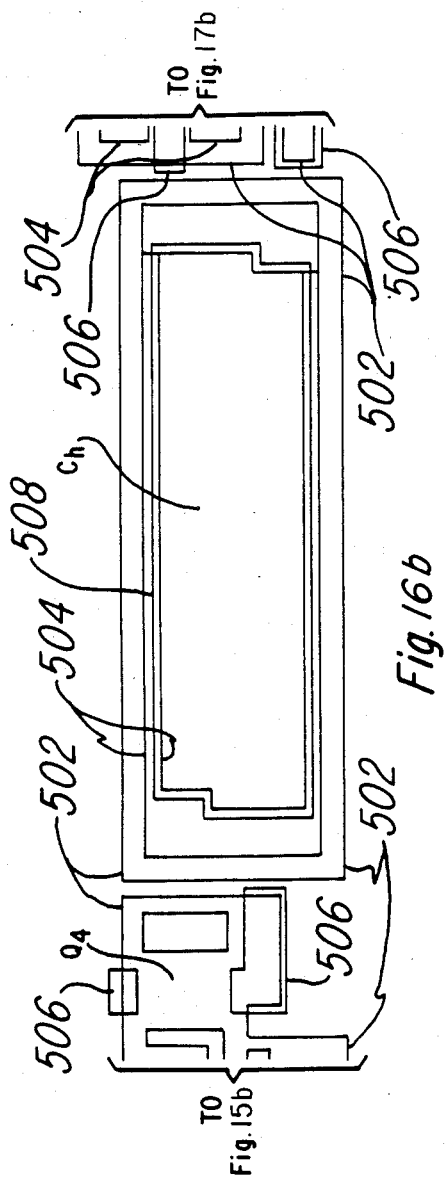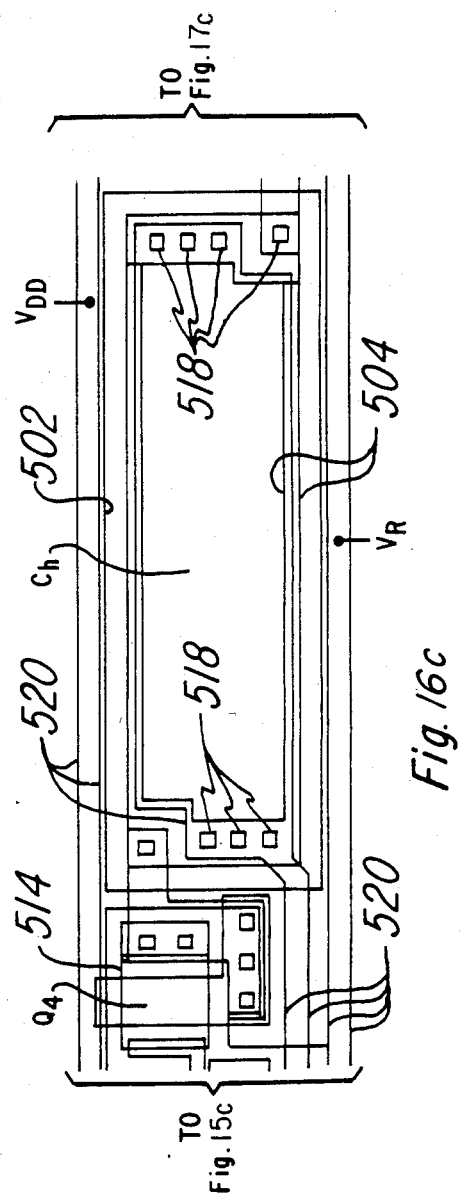

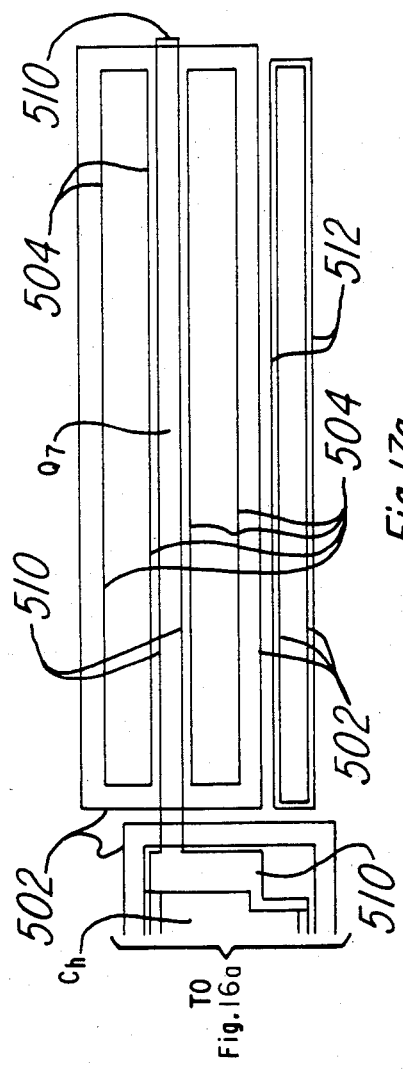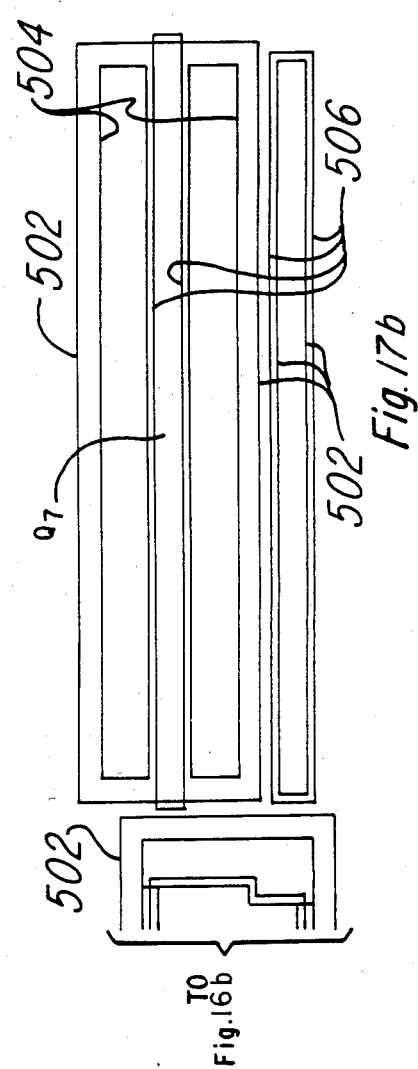
Fig.17a
Fig.17b

CCD IMAGER WITH ON-CHIP PROCESSING

CROSS-REFERENCES TO RELATED APPLICATIONS

The following patent applications, of common assignee hereof contain related subject matter, and all are hereby incorporated by reference:
Ser. No. 770,323 filed Aug. 27, 1985;
Ser. No. 770,325 filed Aug. 27, 1985;
Ser. No. 770,111 filed Aug. 27, 1985;
Ser. No. 770,322 filed Aug. 27, 1985;
Ser. No. 770,112 filed Aug. 27, 1985;
Ser. No. 770,337 filed Aug. 27, 1985.

BACKGROUND AND SUMMARY OF THE INVENTION

The present invention relates to CCD imagers.

One key driving parameter in CCD imagers is the noise. A CCD imager with improved signal-to-noise ratio will have better image quality, better dynamic range, and better low-light performance.

The prior art normally uses a very simple sense amplifier on chip with the CCD array for charge detection; for example, a simple source follower stage is commonly used. The output of the simple charge detection amplifier will then be sent off chip for processing by a more complicated amplifier, such as a correlated double sampler.

By contrast, the present invention teaches a CCD imager with one or more correlated-clamp-sample-and-hold amplifiers on chip. (This amplifier functions very similarly to the correlated double sampling amplifiers of the prior art.) This structure is itself believed to be novel, and moreover the amplifier configuration preferably used includes a number of other novel features.

Integrating a correlated-clamp-sample-and-hold amplifier with a CCD imager results in at least two major advantages: first, noise is reduced, simply because the signal driven off chip is not low level, but has already been converted to a reasonable level.

Second, on-chip processing eliminates problems with timing which can result from pulse delays introduced in the logic in the CCD driver circuits. Temperature-dependent variations and power-supply sensitivity of these delays make them somewhat unpredictable, and since it is difficult to acquire synchronization of a data stream at video rates, off-chip video signal processing can be quite a difficult task. The present invention avoids this problem.

Third, another particular advantage of integrating a correlated-clamp-sample-and-hold amplifier on-chip is that a dummy charge-sensing node which has essentially the same topography as the active charge-sensing node can be used to provide a reference input to the amplifier which minimizes the reset noise contributed by the primary charge-sensing node. Since the active and dummy nodes are integrated in the same monolithic semiconductor layer, better matching of their characteristics is assured, and therefore better noise cancellation will be attained.

A further related advantage of using a dummy charge-sensing node on-chip is that the dummy node and the active charge-sensing node can be connected to the same on-chip reference voltage generator, avoiding any mismatch in this respect.

According to the present invention, there is provided: A CCD structure comprising: a chain of CCD wells; a first charge-sensing node coupled to one end of said chain of CCD wells; clocking means for clocking charge packets from said end of said chain of CCD wells into said first charge-sensing node; a buffer amplifier connected to sense the voltage on said first charge-sensing node; reset means for resetting said charge-sensing node to a predetermined potential; a dummy charge-sensing node, said dummy node being topologically similar to and integrated in a common body of monocrystalline semiconductor material with said first charge-sensing node; and means for sensing the voltage change on said first charge-sensing node (which occurs after a charge packet has been transferred into said first charge-sensing node) with reference to the voltage on said dummy node.

BRIEF DESCRIPTION OF THE DRAWING

The present invention will be described with reference to the accompanying drawings, wherein:

FIG. 6 shows a cross section of a sample structure for the detection node 216 preferably used in the amplifier of FIG. 4a.

FIG. 10A shows how the combination of virtual barrier and virtual well implants creates n-type source/drain extension regions (LDD regions) 40 in the MOSFET devices in the periphery.

FIG. 10B shows how the virtual phase electrode implant also forms the gates of JFET devices in the periphery.

FIG. 11 shows a plot of noise spectral density at 200 kilohertz vs. drain voltage.

FIGS. 14A, 14B, 14C, 15A, 15B, 15C, 16A, 16B, 16C, 17A, 17B, and 17C show the presently preferred layout of critical portions of the amplifier. These figures are overlays showing the mask layout: FIGS. 14A, 15A, 16A, and 17A show the moat 502, source/drain 504, poly 510, and the patterned channel stop 512 levels; FIGS. 14B, 15B, 16B, and 17B show the moat 502, source/drain 504, patterned channel implant 506 (which is performed before the patterned channel stop implant 512), and As-well (clocked well) 508 levels; FIGS. 14C, 15C, 16C, and 17C show the moat 502, source/drain 504, virtual well 514, virtual phase electrode (boron) 516, contacts 518, and metal 520 levels. These figures all adjoin each other; left to right, the order is FIG. 14, FIG. 15, FIG. 16, and FIG. 17.

DESCRIPTION OF THE PREFERRED EMBODIMENTS

The process preferably used in manufacturing devices in accordance with various of the points of novelty taught by the present application will first be described in detail.

Processing

Figure 8A:
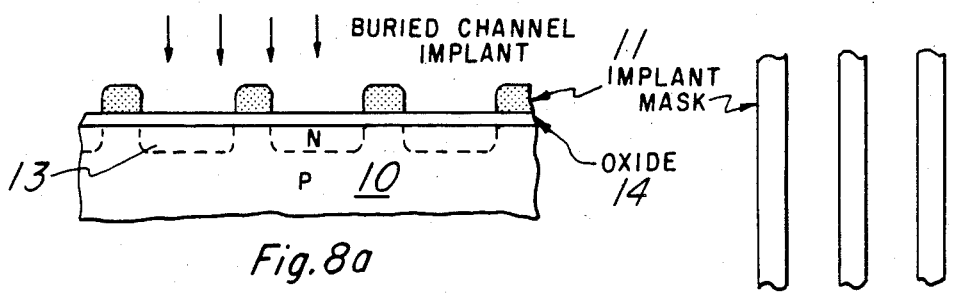
FIGS. 8A–8C show key steps in a novel method of making a CCD, using a two-mask channel definition process.
Figure 8B:
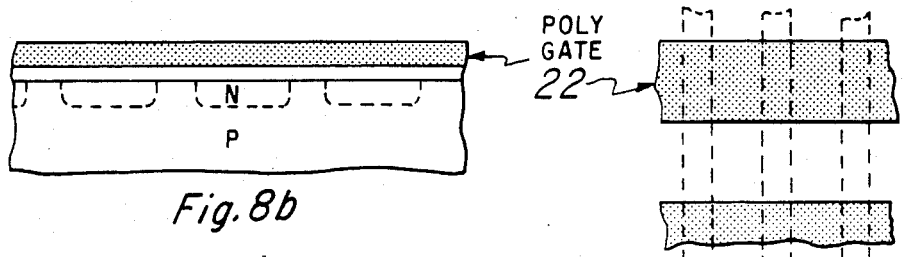
Figure 8C:
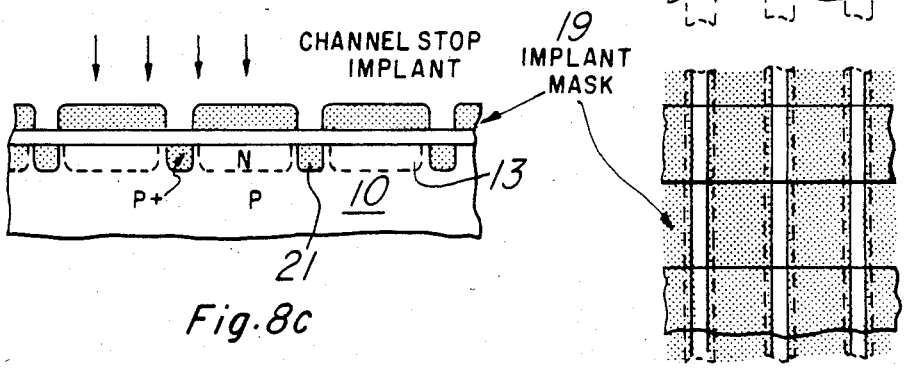
Figure 9:
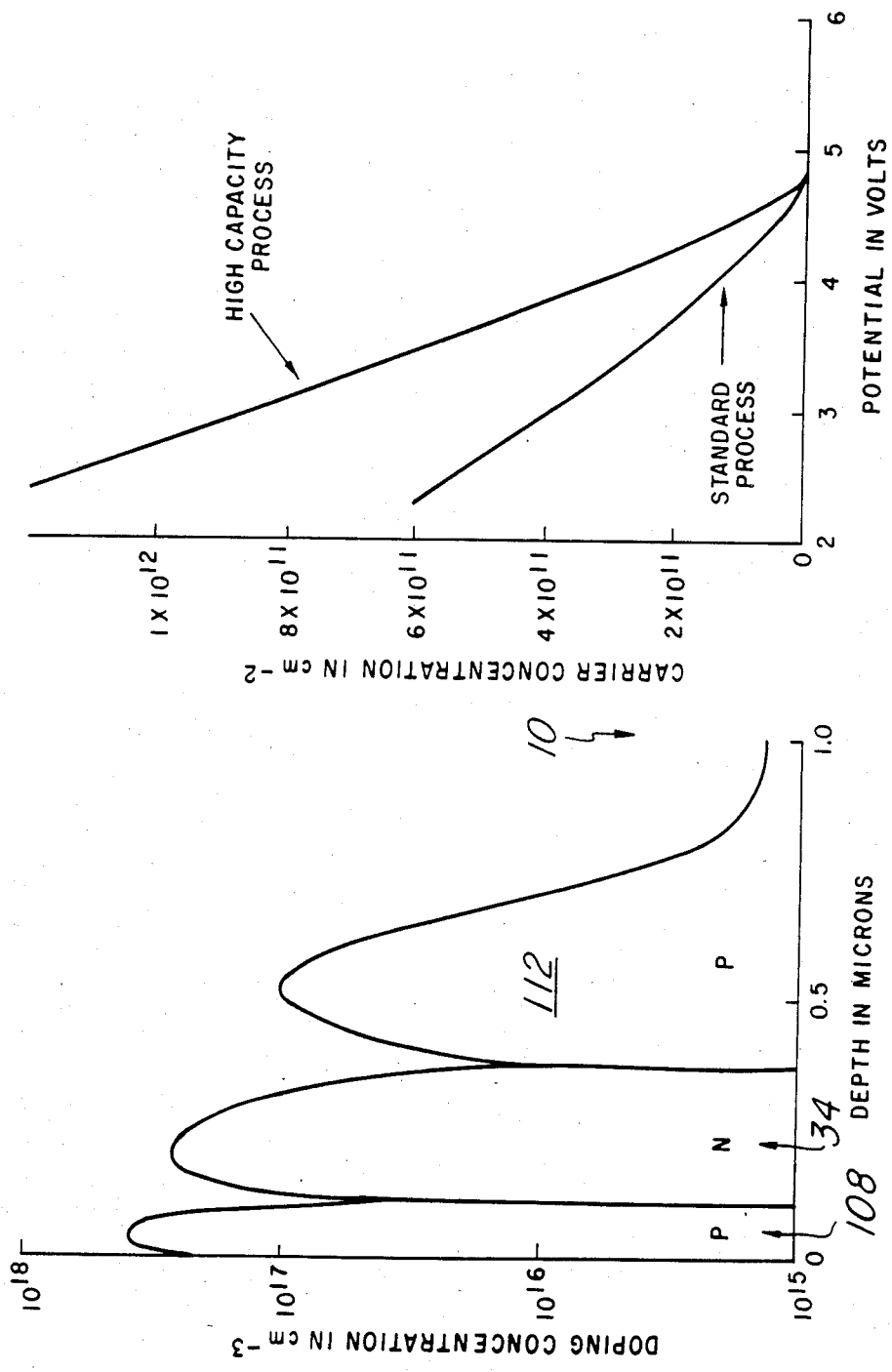
FIG. 9 shows doping profiles and the corresponding charge-potential curve for a new high-well-capacity CCD process using deep p-type regions 112 as shown in FIG. 3. A charge-potential curve for a standard process is shown for a comparison.

As shown in FIG. 8A, a buried channel implant is patterned by an implant mask 11, to produce patterned channels 13. Then (after the clocked wells have been formed), the poly gate 22 is patterned, as shown in FIG. 8B. Next, a channel stop implant is screened by an implant mask 19, to produce patterned p+ channel stop regions 21 as shown in FIG. 8C.

Thus, since the channel stop implant is applied after the poly gate 22 has been patterned, the p+ channel stops 21 do not extend continuously along the full region of the channel, but are interrupted every time they are intersected by a portion of a poly gate level 22. This means that the width of the channel diffusion 13 under the poly gate 22 is increased, since there is no p+ region 21 to outdiffuse in these regions. This means that the capacity of the clocked well is increased.

To correspondingly increase the capacity of the virtual phase well, one additional (Hi-C) implant is preferably performed. This is a deep p-type implant, with a stopping distance near or below the bottom junction location which will be defined by the doping profile of the buried channel locations 13. Thus, the capacity of both virtual phase and clocked phase is increased.

The foregoing description summarizes a few of the key features which distinguish the present invention from the prior art. The fabrication process will now be discussed in great detail, with primary reference to the CCD array. Additional masks and fabrication steps may be used for fabrication of the periphery, including some which are entirely conventional in NMOS logic and will not be discussed in any great detail. Also, many minor processing steps (such as cleanups, growth of the anti-Kooi-effect oxide, stripping of masks, etc.) are omitted, because they are very widely known and their insertion at appropriate points is totally obvious to anyone skilled in the art.

It should also be noted that the following description gives many specific implant dose and energy specifications. These are illustrative only, provided to better permit one skilled in the art of fabricating semiconductor devices to make and use the various inventions disclosed, and do not limit the scope of the invention. In particular, the currently preferred ranges for dose and energy are given; but, as is well known to processing engineers, such specifications may be very widely varied. Many of the parameters given may be varied by plus or minus 50% or more, depending on the tradeoffs exploited by the process engineer. As is well known, there are innumerable tradeoffs between the parameters of any one implant step and oxide thicknesses, supply voltage, annealing conditions, the parameters of other implant steps, etc. Moreover, many substitutions of technologies can be made (to name only one example, sidewall masked isolation could be used instead of LOCOS), and steps can be interchanged and modified as well.

Many parts of the specification of the present patent application have particular reference to a process which uses virtual phase CCD technology. Background on virtual phase CCD technology can be found in the following articles, all of which are hereby incorporated by reference: Hynecek, "Virtual Phase Technology: a New Approach to Fabrication of Large-area CCDs," 28 IEEE Transactions on Electron Devices 483 (1981); Hynecek, "Electron-Hole Recombination Antiblooming for Virtual-Phase CCD Imager," 30 IEEE Transactions on Electron Devices 941 (1983); Hynecek, "Design and Performance of a Low Noise Charge Detection Amplifier for VPCCD Devices," 31 IEEE Transactions on Electron Devices 1713 (1984); Hynecek, "Design and Performance of a High-resolution Image Sensor for Color TV Applications," forthcoming in the August 1985 issue of IEEE Transactions on Electron Devices; and U.S. Pat. No. 4,229,782, which is also hereby incorporated by reference.

However, many of the innovations described are perfectly applicable to other CCD technologies as well. Virtual phase technology is referred to so extensively merely because (1) it represents the currently contemplated best mode of using the various inventions described, and (2) it is often more advantageous to apply various innovations described here in the context of virtual phase technology than it would be in the context of other CCD technologies—i.e. the innovations are applicable and advantageous in many other technologies, they are simply more advantageous in virtual phase technology.

The processing sequence preferably used will now be described in great detail.

A substrate having a monocrystalline semiconductor upper portion, for example a p-on-p+ silicon wafer having a 10 micron thick epitaxial layer doped to around $1 \times 10^{15}/cm^3$ p-type, is provided as starting material.

The first masking step used is a moat masking step. This is used, as is conventional, to pattern a silicon nitride masking layer; the openings in the nitride layer expose selected regions to a LOCOS-channel-stop implant (e.g. $1 \times 10^{14}/cm^2$ of boron at 60 keV) and then to a long oxidation, in order to form LOCOS isolation surrounding moat regions (moat regions are the regions where active devices are to be formed) in the periphery. Since no oxide isolation is needed in the CCD array, the whole array is masked from the field oxidation steps.

Next, a source/drain mask is used to mask off the entire CCD array (except for diode locations, such as the clearing diodes along the top and bottom edges of the array), so that an n+ source/drain implant can be used to form NMOS devices in the periphery. This implant may be, for example, $3 \times 10^{15}/cm^2$ to $7 \times 10^{15}/cm^2$ of phosphorus at 30–60 keV. Note that this is not a self-aligned source-drain implant, as used in most MOS processes: the virtual well implant will later be used to form source/drain extensions (LDD regions) which are self-aligned to the poly gate level. (This mask is also used to mask a plasma etch which strips the LOCOS nitride from exposed portions of the moat (in the periphery) and from the exposed portios of the CCD array. The portion of the LOCOS nitride under this mask can be removed by wet etching later.) The use of a masked source/drain implant not only provides low-resistance diffused interconnects and LDD structures (which reduce hot-electron problems), but also is advantageous if JFET devices are used in the periphery: the masked source/drain implant means that the JFET channel regions can be screened from this implant. Instead of implanting, this step of introducing dopants may be performed as a $POCl_3$-deposition step instead.

Next, implant mask 11 is patterned to expose the CCD channel regions, and an implant of $1 \times 10^{12}/cm^2$ to $2 \times 10^{12}/cm^2$ of phosphorus at 100–150 keV is applied to form buried channel regions 13, as shown in FIG. 8A.

Next an arsenic implant of $2 \times 10^{14}/cm^2$ to $4 \times 10^{14}/cm^2$ at 20–30 keV is applied to form clocked wells.

Figure 12:
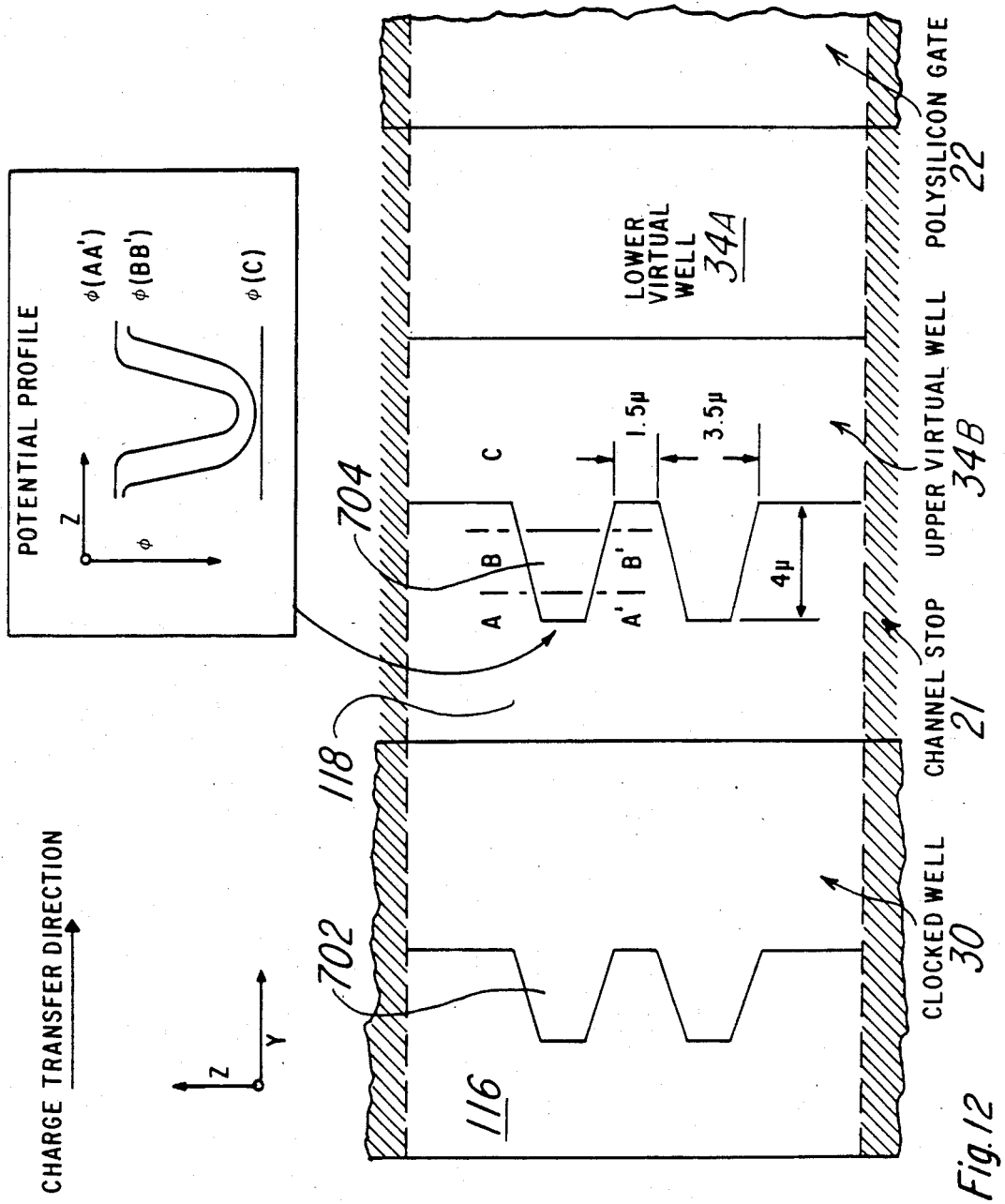
FIG. 12 shows a plan view of the implant masking used, in an alternative class of embodiments which is particularly attractive where pixel spacing is more than 20 microns, to achieve a graded profile of the potential energy for electrons within each CCD pixel, to promote higher charge transfer efficiency.
Figure 13:
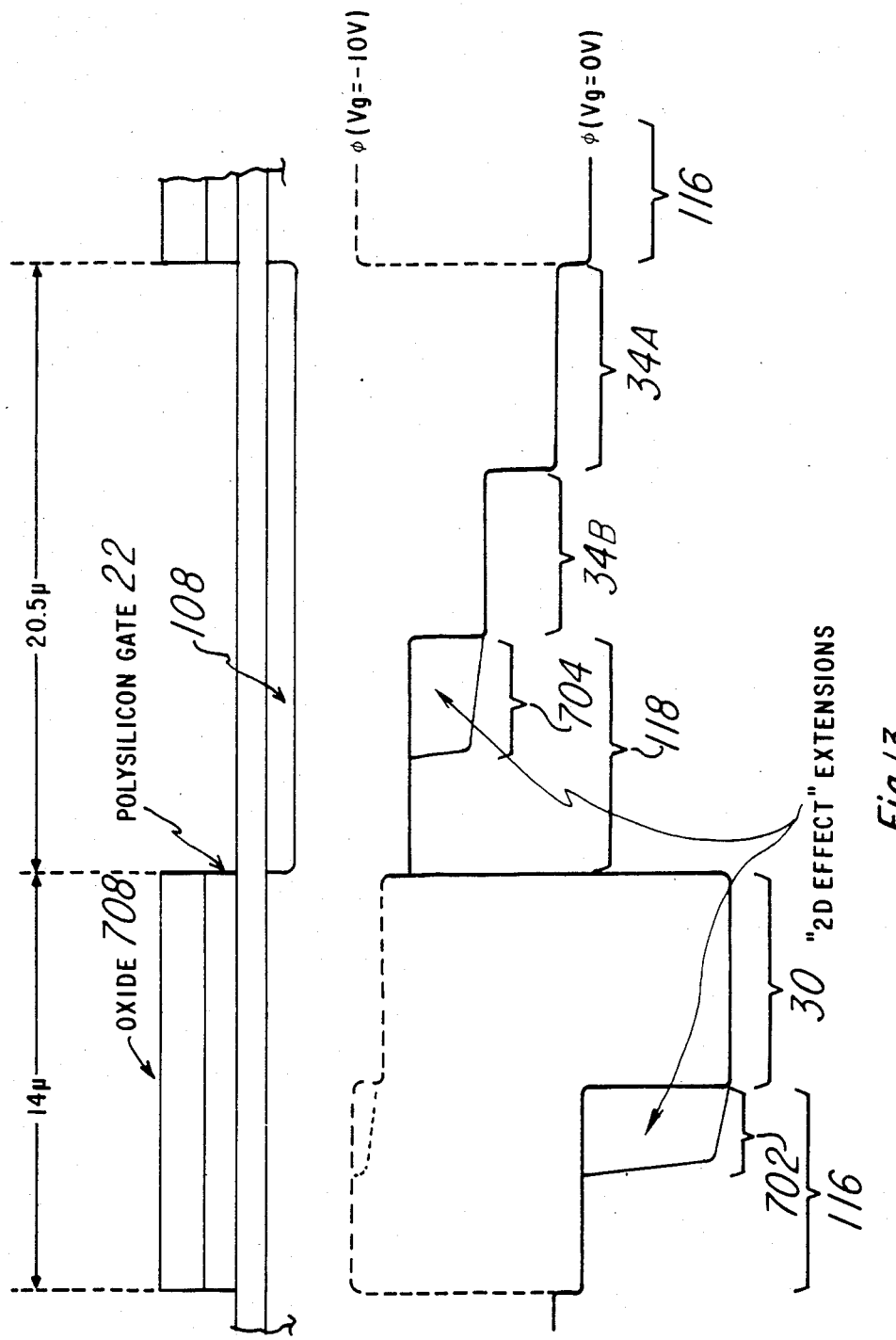
FIG. 13 shows an example of the potential energy profiles which are achieved by this structure.
Figure 14C:
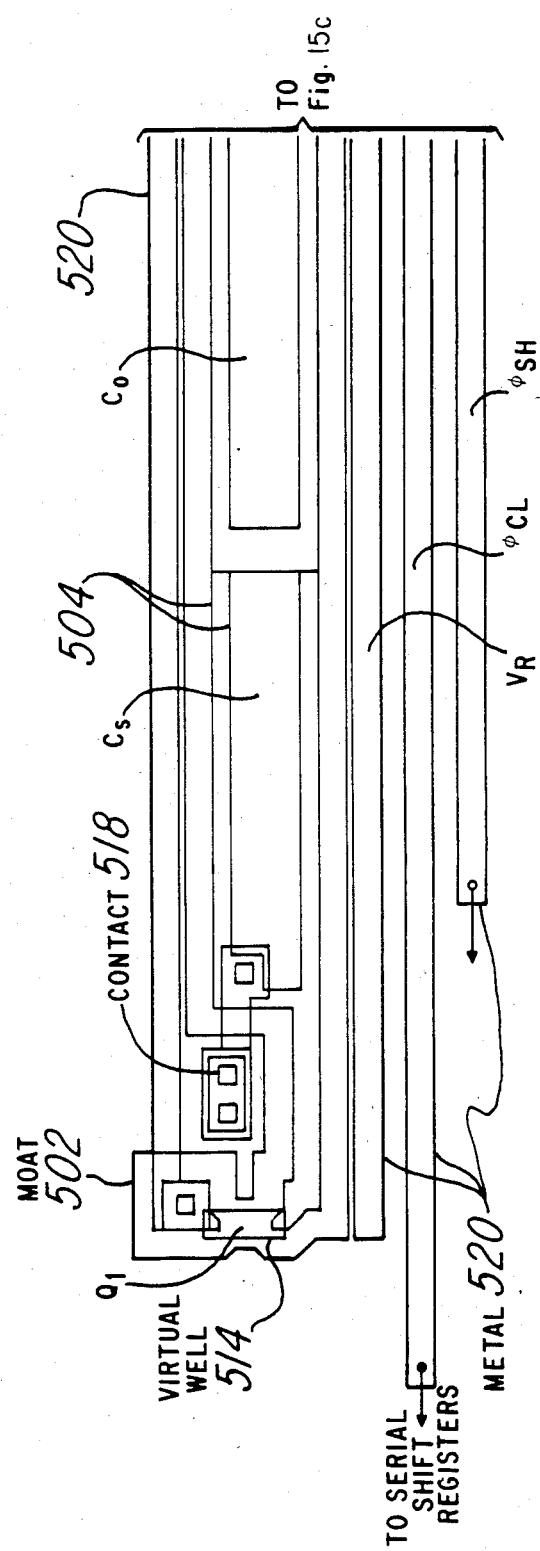
Figure 15C:
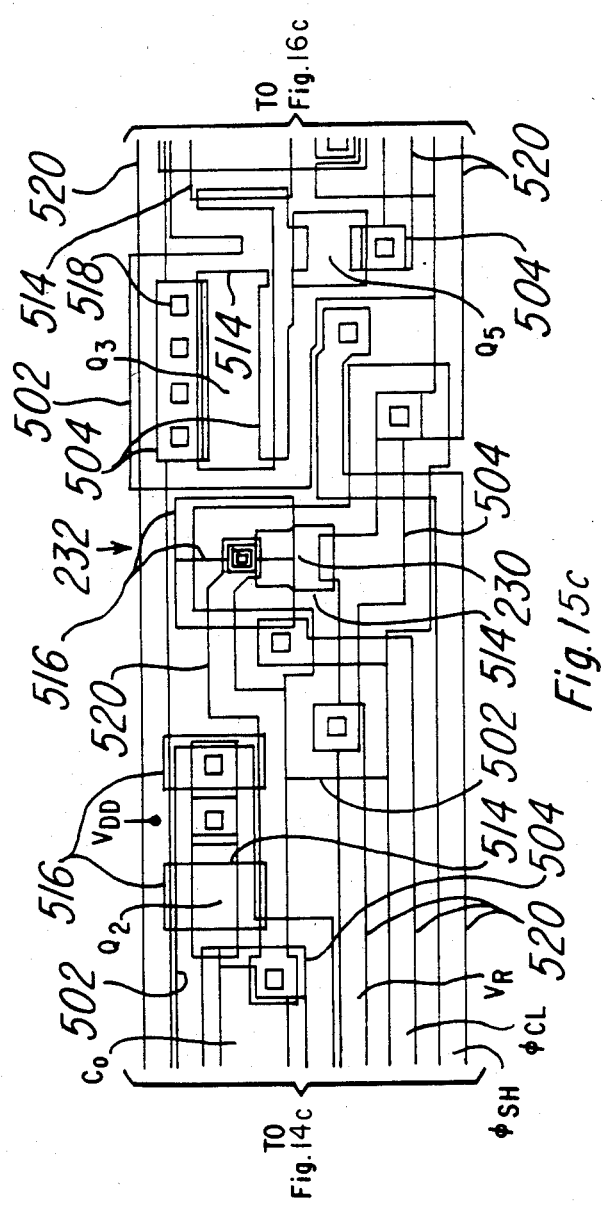
Figure 16A:
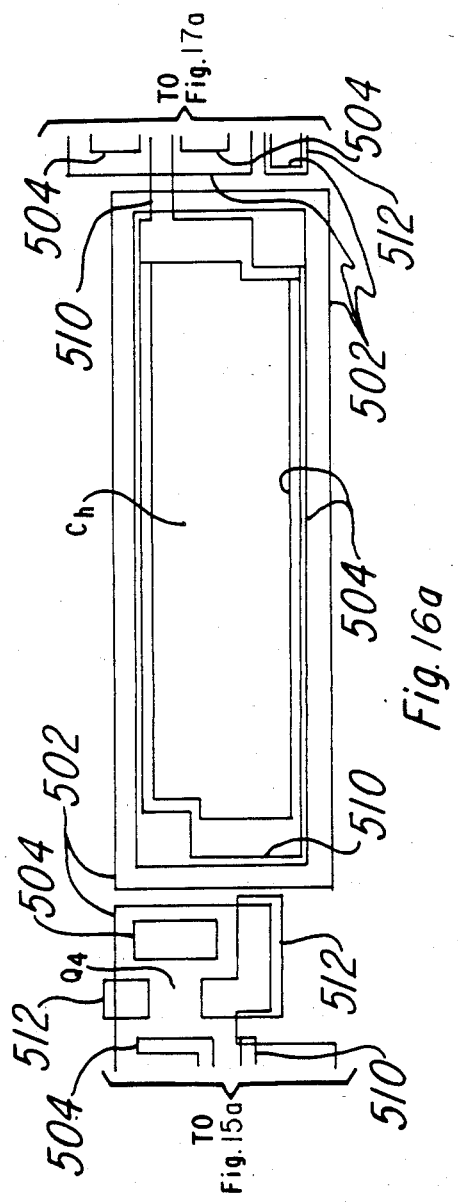
Figure 17C:
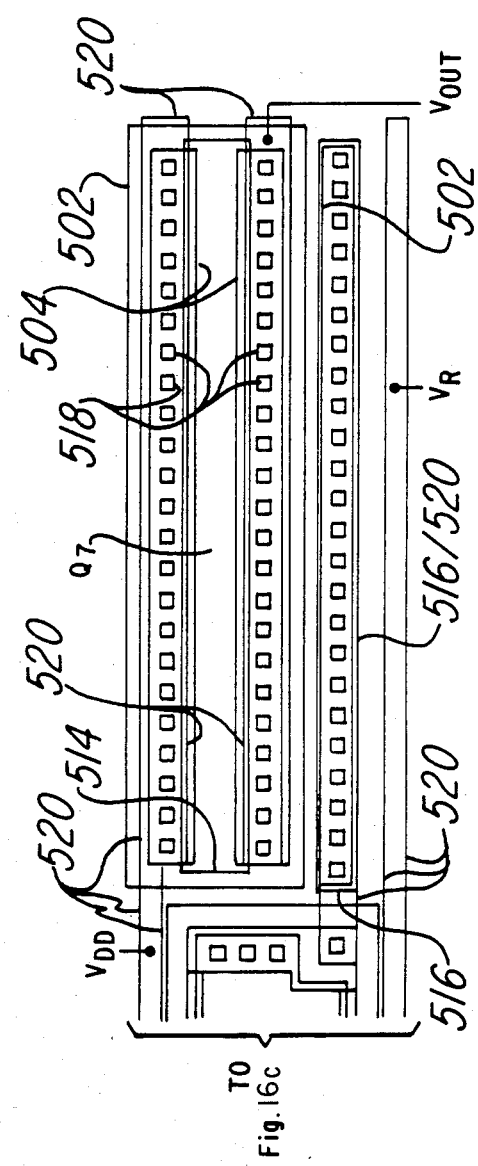

An alternative class of embodiments can be provided by a modification to this step of the process. FIG. 12 shows a plan view of the wedge-shaped extensions 702 which can be used with the clocked well masking. This alternative class of embodiments is particularly attractive where pixel spacing is more than 20 microns, to achieve a graded profile of the potential energy for electrons within each CCD pixel; such a graded profile promotes higher charge transfer efficiency in large devices. FIG. 13 shows an example of the potential energy profiles which are achieved by this structure.

That is, in large dimension CCDs, the transport of carriers within a large well region will be limited by carrier diffusion statistics except where the carriers are close to the potential gradient at the boundary between the well and the barrier of the succeeding phase. This carrier diffusion process imposes a trade-off between clock frequency and charge transfer efficiency, but it is highly undesirable (particularly in a frame transfer device) to have to make any compromise in either of these parameters. Thus, it has been recognized as desirable, in the prior art, to introduce some potential energy gradation within the wells, to accelerate complete transfer of the carriers to the well boundary when the barrier of the adjacent phase is brought to a lower potential energy.

This can be a problem in the array of large CCDs, but it can also be a particular problem in the multiplexing and serial register portions of CCDs as small as (for example) an 11 mm diagonal (488 by 780 pixels) device with three serial registers, where the pitch of each serial register corresponds to three times the horizontal pitch of the array.

Prior art methods of accomplishing this have used multiple implants, but of course each extra implant requires an extra mask level, so that this has been tremendously expensive in terms of processing complexity. A novel way to accomplish this is by the use of two-dimensional potential effects; such effects are known, but the application of them to achieve potential gradation within a single well region in a CCD is believed to be novel. That is, among the novel teachings in this application is that potential gradients within a well can be achieved merely by geometrical modifications to the mask geometries of the patterned implants which already require masking steps, without any requirement for use of additional masking steps.

Figure 3:
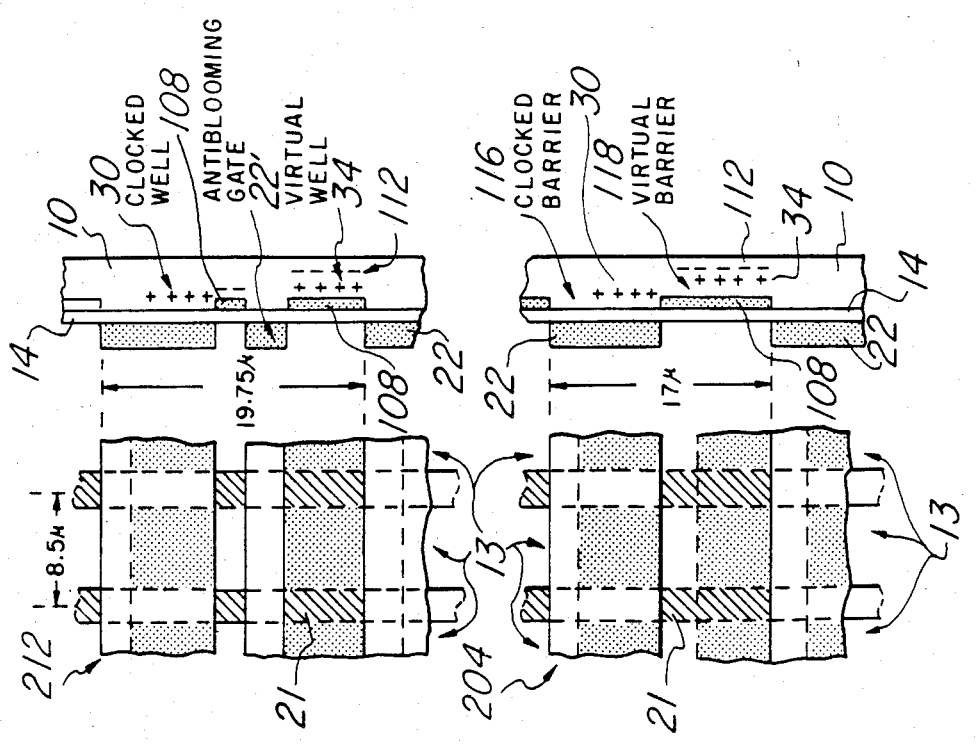
FIG. 3 shows plan and section views of CCD cells in the image area 212 (the top portion of the figure) and storage area 204 (the bottom portion of the figure) for one sample embodiment, namely a 488V×774H frame transfer VPCCD image sensor with 8 MM image sensing area diagonal.

In the embodiment shown in FIG. 12, the shape of clocked well 30 is modified to include wedge-shaped extensions 702. The virtual well region 34 shown in FIG. 3 is split, in the embodiment of FIG. 12, into two portions, an upper virtual well 34B and a lower virtual well 34A, where the upper virtual well 34B has a potential energy intermediate between that of the lower virtual well 34A and that of the virtual barrier 118. (One extra mask is required to accomplish this.) Moreover, the upper virtual well 34B is patterned to include wedge-shaped extensions 704 protruding into the virtual barrier 118, and the potential profiles at the top of FIG. 12 show the lateral variation in potential across these wedges along the marked sections A through C. That is, the device structure shown effectively provides two regions of intermediate potential in the virtual phase: one is the "upper virtual well" 34B, which provided in the conventional way at the cost of a mask; but the other is provided by the wedge-shaped extensions, which effectively provide an additional intermediate potential region without requiring an additional masking step. The "upper virtual well" 34B can alternatively be thought of as a lower barrier region, since any charge transferred into upper virtual well 34B will all be collected in the lower virtual well 34A anyway.

FIG. 13 shows potential profiles for the regions of FIG. 12. Note that the potential profiles for the clocked portions 116, 702, and 30 are shown for both states of the polysilicon clocked electrode 22.

However, the embodiment of FIG. 13 and FIG. 12 is not the principal preferred embodiment, and discussion of the principal preferred embodiment will now resume.

Next, gate oxide 14 is grown on all exposed areas of silicon, to a thickness of, for example, 700Å, and poly gate 22 is patterned.

Next, a channel stop implant mask 19 is used to expose channel stop regions 21 to a p-type implant, for example, $1 \times 10^{13}$/per $cm^2$ to $5 \times 10^{13}$/per $cm^2$ of boron at 100–200 keV.

Next, a virtual well implant, for example $1.3 \times 10^{12}/cm^2$ of phosphorus at 200 keV, is performed into areas 34. As discussed above, if it is necessary to create potential gradients within some or all of the virtual wells, the mask for this implant step may be modified to include wedge-shaped extensions, and the mask itself may be split, i.e. an additional mask level may be used to separately pattern both an upper virtual well and a lower virtual well. However, use of this additional mask is not presently preferred.

Next, a blanket virtual barrier implant, for example $1.4 \times 10^{12}/cm^2$ of phosphorus at 300 keV, is preferably performed overall.

The virtual well, virtual barrier, and channel stop implants can be performed in any order. However, one useful and novel teaching of the present application is that the channel stop implant should be patterned after the poly gate 22 has been patterned.

Next, a deep p-type implant, for example $2 \times 10^{12}/cm^2$ of boron at 200 keV or more, is preferably performed. This implant functions as a "Hi-C" implant to increase the capacity of the virtual well locations. This implant is not masked in the array, but may be masked in the periphery to provide control over the turnoff characteristics of the JFET devices and avoid degrading the diode breakdown of the n+ source/drain diffusions.

It is preferable that the gate level 22 be thick enough to stop this implant and the channel stop implant. However, stopping boron at more than 100 keV requires a significant thickness of polysilicon, and this conflicts with another goal: to boost quantum efficiency, it is desirable to have the polysilicon gate 22 thin enough to be partially transparent, so that at least some photocarriers can be collected in the clocked wells (in addition to the virtual wells) during the frame exposure period of the imaging array. This will not be practical unless the gate 22 is reasonably thin, e.g. half a micron or less.

To avoid this dilemma, a further novel teaching of this application is that the gate structure should include a thick transparent oxide (not shown) overlying the polysilicon 22. This layered structure is patterned by conventional stack-etching methods. For example, the gate may be polysilicon 2000A to 3000A thick and doped to a sheet resistance of around 20 to 100 ohms per square, and the transparent oxide may be CVD or plasma oxide, and be at least 2000A to 5000A thick. In future embodiments it may be desirable to scale the poly layer 22 down to 500A thick. Reducing the thickness of the poly increases its transparency and assists in collecting photocarriers in the clocked wells during the exposure interval, thereby raising the quantum efficiency.

Next, a high-dose low-energy boron implant (which also is blanket in the array, but selectively masked in the periphery) is used to form the virtual phase electrode. This step also forms the gates of JFETs in the periphery. This implant may be, for example $6 \times 10^{12}/cm^2$ of boron at 35 keV. As shown in FIG. 10B, the virtual phase implant creates the JFET gate 36. The JFET channel region 38 is created by the virtual well and virtual barrier implants.

In the MOSFET devices in the periphery, as shown in FIG. 10A, the combination of virtual barrier and virtual well implants creates n-type source/drain extension regions (LDD regions) 40.

One advantage of the process of the present invention is that it creates both surface channel MOSFETs and buried channel MOSFETs. (The surface channel MOSFETs are enhancement-mode devices, and the buried channel MOSFETs are depletion-mode devices.) To create the buried channel MOSFETs, the moat region in the periphery is exposed to the buried channel implant (a light-dose phosphorus implant, which is performed before the poly gate level is patterned.) The use of buried channel devices has circuit advantages, as will be discussed below. To create the surface channel MOSFETs, the moat regions in the desired surface channel device locations are blocked from the buried channel implant. Other implanting steps may also be used to adjust the threshold voltages of the active devices, as is customary in NMOS (or CMOS) processing.

Buried-channel MOSFETs give good low-noise performance, but only as long as their drain voltage is kept sufficiently low. A plot of noise spectral density at 200 kilohertz vs. drain voltage can be seen in FIG. 11.

When a buried-channel device is biased above saturation, hot electrons are believed to be generated in the channel, and will produce additional electron-hole pairs through impact ionization. In a buried-channel transistor, some of the generated holes will be confined in the potential well between the bulk channel and the silicon-silicon dioxide interface. The holes must then travel along the interface from the drain region to the vicinity of the source and finally to the substrate or along the side of the gate to the channel stops. If enough holes accumulate at the interface, the threshold voltage of the transistor will shift, and a drain current increase will be observed. This phenomenon becomes more acute as transistor gate width is increased, and it is also exacerbated by the potential barriers for holes which sometimes exist at the edge of the buried channel next to the thick field oxide region.

To avoid this noise problem of buried-channel devices, while retaining the good low-noise small-signal characteristics of such devices, the present invention teaches combination of surface-channel MOS transistors with buried-channel MOS transistors in CCD peripherals. The surface-channel transistor can be correctly biased for high output current levels by the levels provided from preceding low-noise buried-channel stages, using a common drain supply voltage (VDD) for both surface-channel and buried-channel devices. That is, the surface-channel MOS output stage permits the use of low-noise buried channel devices in the small-signal stages, but avoids the necessity of biasing the buried-channel transistors into their high-noise regime for driving the output stage. The combination of the buried-channel and surface-channel transistors thus offers lower drain bias requirements, lower power consumption, lower output DC voltage, and, most importantly, superior noise performance.

With the processing parameters used in the presently preferred embodiment discussed here, the surface channel devices will have a threshold voltage in the range of 0 to 0.5 volts. The drain voltage (VDD) supply is preferably in the neighborhood of 12 volts, and the surface channel output device is biased to a gate voltage in the neighborhood of 8 volts. Since the DC output voltage is about 5 volts (this is determined by the dimensions of the load transistor), the voltage from gate to source is in the neighborhood of 3 volts. The buried channel devices will have threshold voltages in the range of −6 to −7 volts, again at about 12 volts VDD supply, and the gate to source voltage is in the neighborhood of −3 volts (i.e. the gate is biased about 3 volts into the on regime).

Processing continues with other conventional NMOS processing steps used for fabrication of the periphery, including metal patterning, contact patterning, and (if needed) second poly. Of course, an opaque protective overcoat cannot be used over the imaging array area; instead of the usual compressive nitride protective overcoat, an oxide overcoat is preferably used. The metal level, in addition to its interconnect functions, is preferably patterned to cover the dark reference area 202 and storage area 204, and may optionally (if not needed for interconnect) also be used to cover serial shift registers 206, multiplexer 208, and dummy elements 210. (The relative locations of these elements, together with image area 212, are shown in FIG. 10.)

FIG. 3 shows plan and section views of CCD cells in the image area 212 (the top portion of the figure) and storage area 204 (the bottom portion of the figure). In the image area 212, the poly level 22 is used not only to form the gates of the cells but also to form antiblooming gates 22'. During the virtual phase, i.e. when all the signal charge should be in virtual well locations if it is not overflowing due to blooming, the antiblooming gate can be briefly clocked negative to charge up interface states beneath its oxide with holes (accumulated from the virtual electrode and from the substrate). The antiblooming gate can then be clocked positive to collect stray electrons, which recombine with the holes stored in the interface states. Antiblooming operation is discussed in much greater detail in Hynecek, 30 IEEE Transactions on Electron Devices page 941 (1983), which is hereby incorporated by reference.

The process discussed has created channel regions 13, which are separated by channel stops 21 outside of the poly gate locations 22, and by the background doping of the substrate 10 underneath the poly gates 22. Underneath each poly gate 22 is a clocked barrier 116 and a clocked well 30. The clocked well 30, created by a patterned arsenic implant as discussed above, creates a localized space charge from the ionized implanted arsenic atoms. (In the diagram of FIG. 3, all implants are shown by their net space charges, i.e., p-type implants are shown as negative charges and n-type implants are shown as positive charges.) Underneath the virtual phase electrode 108 (which is created by a blanket boron implant, as discussed above) are virtual barrier portions 118 and virtual well portions 34 (as mentioned above, the virtual well portions 34 are preferably created by a patterned phosphorus implant, and a blanket phosphorus implant is preferably used to create the virtual barrier 13.) (Note that, in the image area 212, the antiblooming gate 22' separates the virtual barrier region 118 from the virtual well region 34.) A deep blanket p-type implant 112 is also preferably used under the virtual well implant, to enhance its capacitance. Since this implant is preferably performed as a blanket implant, it also increases the concentration of the p-type substrate directly underneath the virtual barrier regions.

The CCD array organization which makes use of the processing steps and device structures discussed above will now be described.

Output Structures

Figure 4:
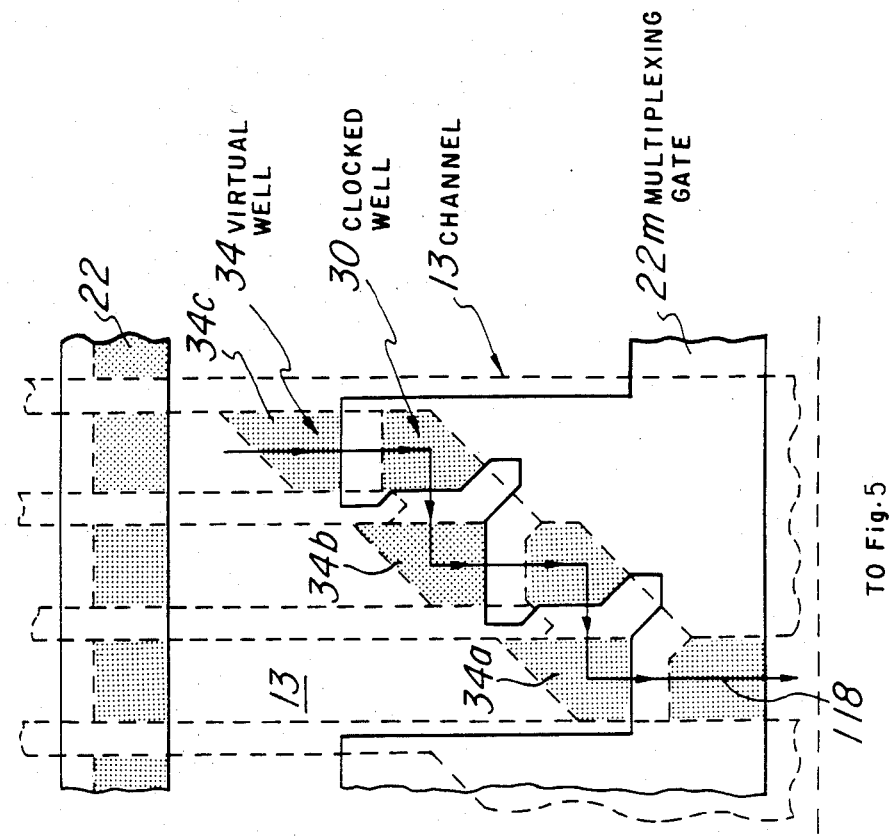
FIGS. 4 and 5 show how the vertical columns of CCD elements (like those shown in FIG. 6) which extend through the image area 212 and storage area 204 are connected at the bottom end of the two arrays.
Figure 5:
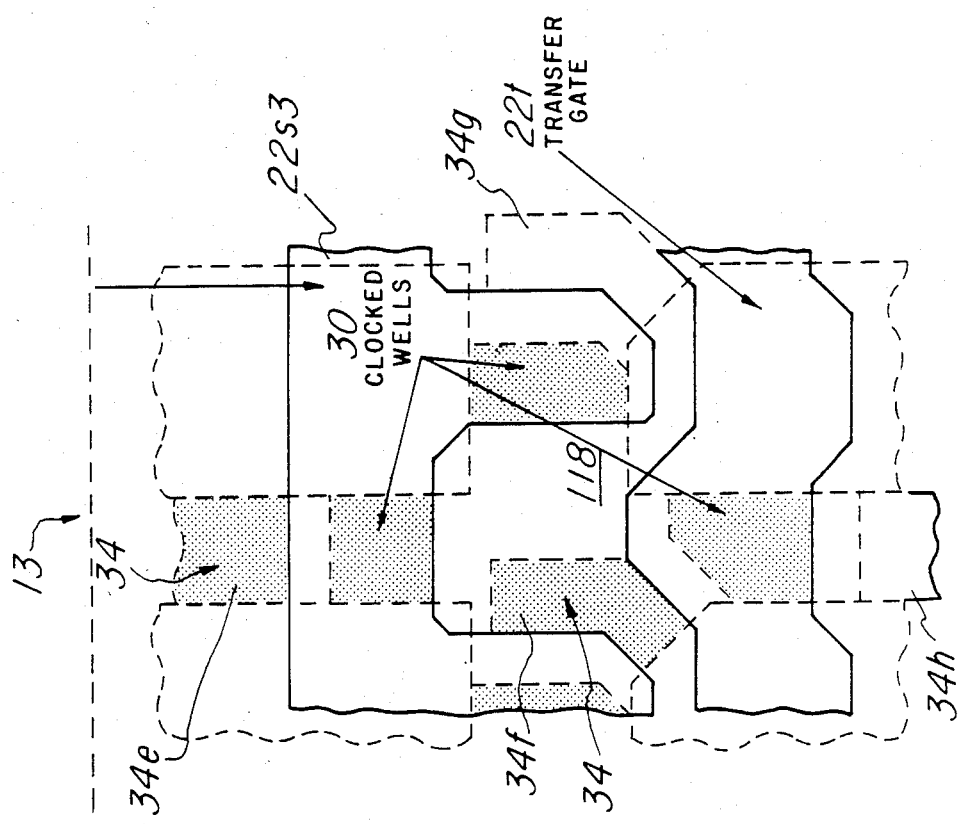

Thus, vertical columns of CCD elements as shown in FIG. 3 extend through the image area 212 and storage area 204. At the bottom end of the two arrays, these columns of CCD elements are connected as shown in FIGS. 4 and 5. The gate 22 shown is the last gate in a series of gates such as that shown in the bottom of FIG. 3. Thus, when one line is being transferred from the storage area 204 into the serial shift registers 206, this gate is clocked to transfer charge packets from the three channels shown into the virtual wells 34 between it and the multiplexing gate 22M. The multiplexing gate 22M is then clocked to transfer charge from virtual well 34a to virtual well 34e at the top of FIG. 5. The same clocking operation transfers charge from well 34b to well 34a, and from well 34c to well 34b.

FIG. 5 shows one serial shift gate 22s3 and one parallel transfer gate 22t. As will be seen from the shown configuration of clocked wells 30 and virtual wells 34, when the serial transfer electrode 22s3 is clocked it will not only transfer charge from virtual well 34e to virtual well 34f, it will also transfer charge from well 34g to well 34f. That is, this gate 22s3, which is the gate of the serial shift register, performs both serial clocking and parallel transfer. The transfer gate 22t will transfer charge in parallel from well 34f (and all the wells corresponding to it) to another row of wells 34h. These wells 34h are adjacent to another serial transfer gate 22s2, not shown; the wells 34h are positioned with respect to serial transfer gate 22s2 approximately as wells 34e are positioned with respect to transfer gate 22s3.

Note that, as charge is being clocked along the serial transfer gate 22s3, it sees a virtual barrier 118 which is wider than the virtual well 34. As may be seen from comparison with FIG. 3, this is not the same as the relative sizing used in the CCD array. These wider barriers assist in achieving good timing and charge transfer efficiency in both of the two possible directions of charge transfer (serial and parallel).

Three transfer gates like 22s3 are preferably used, to separate the three colors of the imager. (To correspond to this separation, color filter stripes are preferably overlaid on the individual channels of image area 212, so that, for example, well 34a has collected information from a red pixel site, well 34b has now collected information from a green pixel site, and well 34c has collected information from a blue pixel site.)

Thus, at the bottom of the storage array there will typically be a multiplexing gate, a first serial shift register gate 22s3, a first parallel transfer gate 22t, a second serial shift register gate 22s3, a second parallel transfer gate 22t, a third serial shift register gate 22s3, and a third parallel transfer gate 22t. Of course, more or less than three colors may be used: four colors could be implemented by using four color stripes over the imaging area, and a fourth serial register 22s4 together with a fourth amplifier.

The third parallel transfer gate 22t is an optional feature, which can be used to shift charge out of the third serial shift register 22s1 into an n+ drain diffusion (not shown). This n+ drain diffusion can be used to clear stray charge out of the whole array at power-up, without the delay of clocking charge serially through the output amplifier. Another n+ drain diffusion (not shown) is preferably located next to the first CCD element in each column at the top of the array; these two drain diffusers both serve to collect stray charge (photocarriers) which might otherwise diffuse into the array to cause high noise in pixels near the edge. A further related feature is two guard columns at the edge of the array: these columns have their wells and barriers patterned oppositely to the other adjoining columns, so that when the array lines are clocked these columns do not transfer charge down to the registers 22s3 etc, but instead transfer their charge into the top n+ drain. This prevents diffusing carriers from causing a spike in dark current at the first and last pixels of each line, which would cause difficulties in subsequent signal processing.

Thus, after serial clocking has emptied the shift registers 206 (i.e., the wells 34e through 34h are all essentially empty), the lines 22 in the storage area 204 are all clocked, so that one line of charge is transferred into the wells 34a, 34b, and 34c above the multiplexing gate 22M. The multiplexing gate 22M is clocked once, to transfer charge from well 34a to well 34e, and serial electrode 22s3 is then clocked to transfer that same charge packet to well 34f. Next, the multiplexing gate 22M is clocked again to transfer the charge packet which was previously in well 34b and is now in well 34a, into well 34e, while transfer gate 22t is clocked at the same time, to transfer the charge which was originally in well 34a into well 34h. By repetition of this operation, the shift register gates 22s3, 22s2, and 22s1 (not shown) are loaded with the charge packets corresponding to the separated colors from the line of information which was just transferred out. The serial transfer gates 22s3, 22s2, and 22s1 are now clocked (while the parallel transfer gates 22t are not clocked) to transfer these charges out through the output amplifiers 214.

Figure 1A:
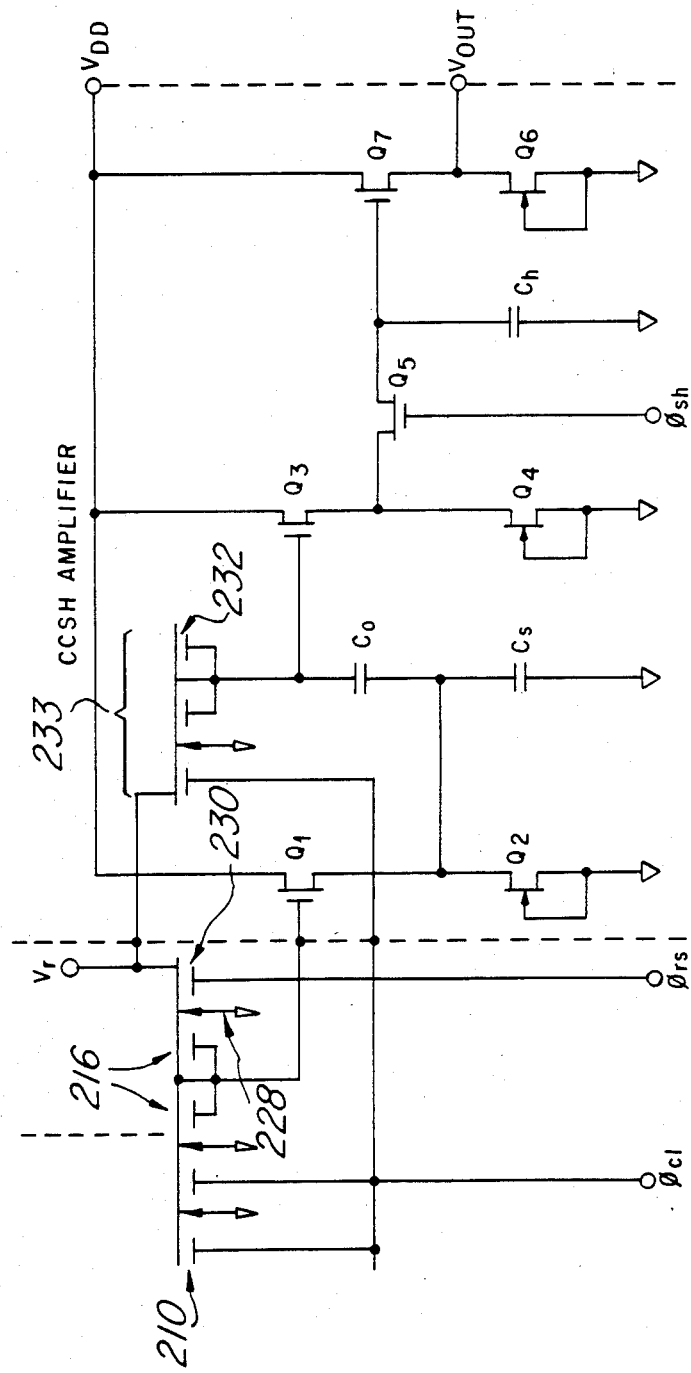
FIG. 1A shows the correlated clamp sample and hold amplifier of the presently preferred embodiment.
Figure 1B:
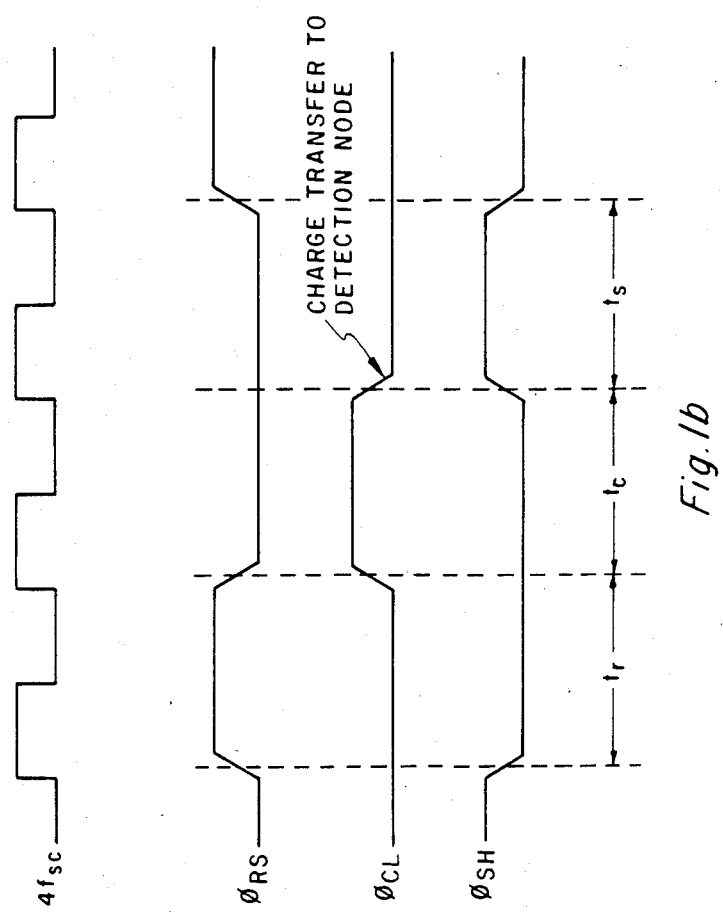
FIG. 1B shows the clock phases $\phi_{RS}$, $\phi_{CL}$, and $\phi_{SH}$ used both to control the amplifier shown in FIG. 4a and also to clock the serial transfer gates $22s3$, $22s2$, and $22s1$ of shift registers 206. The frequency 4fsc shown at the top is the subcarrier frequency (which in this embodiment is four-thirds times the transfer frequency used in CCD chains), and is provided merely as a reference.

Preferably the serial transfer gates 22s3, 22s2, and 22s1 of shift registers 206 are clocked using phases $\phi_{RS}$, $\phi_{CL}$, and $\phi_{SH}$ as shown in FIG. 1B. These same clock phases are also used, in the preferred embodiment, in the output amplifiers 214, as will now be discussed.

FIG. 1A shows the correlated clamp sample and hold amplifier of the presently preferred embodiment.

Note that the ends of the second serial shift register 206 include dummy elements 210. These dummy elements 210 are gated by the serial transfer gates 22s3, 22s2, and 22s1, but the parallel transfer gates 22t need not be included in this portion of the shift registers 206. Each of these shift registers ends in a detection node, as shown on FIG. 1A.

Figure 6:
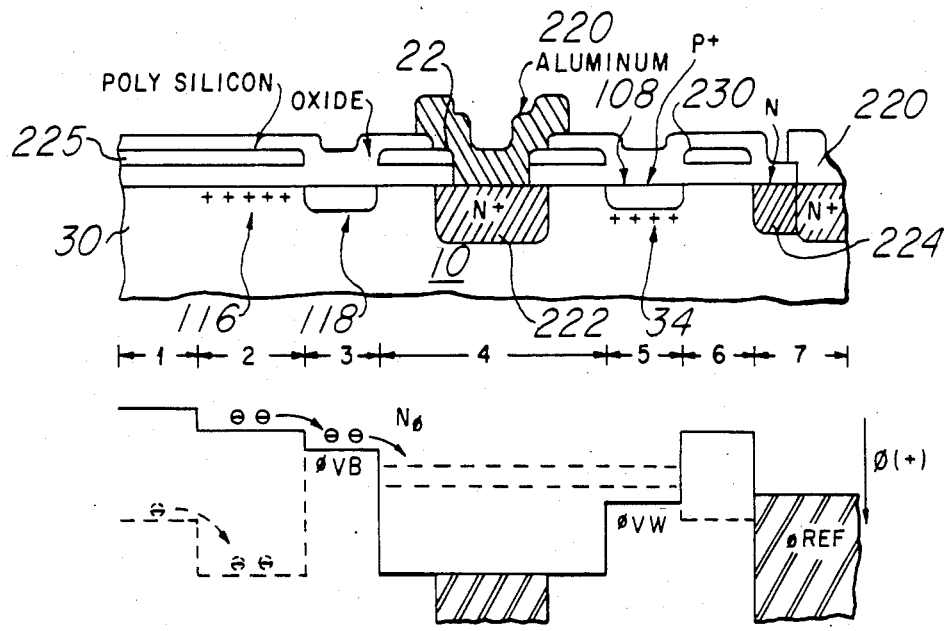

A cross section of a sample structure for this detection node 216 is shown in FIG. 6. The clocked barrier 30 and clocked well 116 are at the end of serial shift register gate 22s1 (or 22s2 or 22s3). By clocking the poly gate 22s1, charge is transferred from clocked well 116 over virtual barrier 118 into the capacitor defined by diffusion 222 and the portion of poly plate 22 and aluminum contact 220 which are tied to it. This node has a reasonably linear charge-voltage relationship, corresponding to a very small capacitance. That is, in this node the gate is shorted to the channel, so that only a small channel-to-substrate capacitance remains for the charge storage. The function of this detection node can also be considered in another way: due to its small capacitance it is an efficient quasi-Fermi-level detector for the charge which is almost entirely stored in virtual well 34.

The n+ diffusion 222 is formed by the source/drain implant: the lightly doped drain extension regions, such as region 224 shown in FIG. 6, are preferably provided by exposure to both the virtual well and virtual barrier implant. Thus, in peripheral NMOS transistors, lightly doped drain extensions 224 are self-aligned to the gate, and the source/drain n+ diffusions 222 need not be.

The diagram of FIG. 1A schematically shows each CCD element as an MOS gate (the clocked gate) followed by a grounded JFET gate (the virtual phase gate). Note that the reset voltage $V_r$ is also connected to detection node 216 through a CCD structure: the clock phase $\phi_{RS}$ is clocked to transfer charge through a virtual phase node 228 to the detection node 216. The reset gate 230 and/or the virtual phase gate 228 are preferably configured to introduce a certain resistance at this point. This can be done by narrowing the patterned channel in this region, or by lengthening the LDD region 224, to introduce more series resistance.

Thus, initially the detection node 216 is reset to approximately a reset voltage $V_r$. Detection node 1 is also connected to gate a source follower stage including transistors Q1 and Q2.

Q1 is preferably a buried channel MOSFET having width of 9 microns and length of 6 microns. Q2 is preferably a JFET having a channel length of 30 microns and a gate width of 6 microns. The very low W/L ratio of this first stage load is used because this device is a high-pinchoff device, i.e. its pinchoff voltage would be in the neighborhood of 4 volts; use of a high-pinchoff JFET here reduces the JFET's noise contribution, but its length has to be greater than its width to keep its current low.) The output of this first source follower stage is connected to the node between capacitor $C_o$ and $C_s$. The channel length can be varied within the range of 3 to 100 microns, or even wider if appropriate process modifications are used, as is well known to those skilled in the art.

Capacitor $C_s$ has the effect of low-pass filtering of the output of the source follower stage which includes Q1: as is well known, less amplifier bandwidth means lower total noise power.

After the reset phase, the clamp phase clock $\phi_{CL}$ is clocked, and, on the falling edge of this clock, a signal charge packet is transferred from CCD register into first detection node 216. This phase is also connected to gate a short CCD channel which provides a dummy element, namely second detection node 232.

The second detection node 232 has essentially the same construction as the first detection node 216, but has slightly larger dimensions. That is, the detection node 232 includes an n+ diffusion 222 which is shorted to a poly capacitor plate, and is separated from the reset voltage supply $V_r$ by a CCD element (both clocked phase and virtual phase, i.e. both MOS and JFET active elements).

Thus, during clock phase $\phi_{clamp}$ ($\phi_{CL}$), the gate of transistor Q3 will see a voltage corresponding to the reset voltage on second detection node 232, but this reset voltage will include less noise than the reset voltage generated on first detection node 216, since second detection node 232 is not only larger but also is connected to large capacitor $C_o$, so that the kT/C noise component is reduced. On the falling edge of the $\phi_{clamp}$, capacitor C-o will pass the output of Q1 through to the gate of Q3, except that the noise component of Q1's output will be partially damped and added to the low-noise reset voltage level already present on Q3's gate (damping is accomplished by the shunt path to ground provided by $C_s$, which provides low-pass filtering of the signal provided to Q3).

The second buffer amplifier preferably includes the buried channel MOSFET Q3 which is 30 microns wide and 6 microns long, together with a JFET current source Q4 which has 20 microns channel width and 12 microns gate length. On clock phase $\phi_{SH}$, the output voltage of the second source follower stage is sampled by transistor Q5 and held on large capacitor $C_h$ to drive the final source follower stage including transistors Q6 and Q7.

Note that JFET load Q4 is not a high-pinchoff device like Q2, but instead is a low-pinchoff device, with a pinchoff voltage in the neighborhood of 2 volts.

An advantage of the process of the present invention is that it does provide two kinds of JFETs, and, as the foregoing example shows, this is advantageous to circuit designers: long high-pinchoff devices can be used for loads where special low-noise performance is required, and low-pinchoff devices can be used elsewhere.

This is controlled by the masking of the virtual well and virtual barrier implants: the high pinchoff devices are exposed to the virtual well implant, and the low-pinchoff devices are exposed to the virtual barrier implant.

Transistor Q7 is preferably a surface channel MOSFET, not a buried channel device like transistors Q3 and Q1, and has a width of 200 microns and a length of 6 microns. Transistor Q6 is another JFET load, and preferably has channel width of 120 microns and gate length of 12 microns. Of course, the specific device dimensions given here may be widely varied, and are provided simply to illustrate as clearly as possible, the best mode of the invention as presently contemplated.

The optimization of amplifier structures of this type for low-noise operation will now be discussed in detail.

Amplifier noise optimization

A further teaching of the present invention is that this general amplifier configuration can be optimized for a given clock frequency and for a given detection node capacitance, to optimize the noise performance. Thus, for NTSC rates and for $C_d$ in the approximate neighborhood of 0.02 pF, $C_o$ should be about 45 times the capacitance $C_d$ of the first detection node 216, $C_s$ should be about 44 times $C_d$, and the ratio x of the source-drain capacitance of transistor Q1 to $C_d$ should be about 1.3; but for other rates these optimal ratios will change. Even for NTSC rates, these three parameters can be varied to provide low-noise performance which is almost as good as that at the optimum values. For example, if x is only 0.6, a figure of merit greater than two can still be obtained by making $C_s$ 80 times $C_d$ and $C_o$ 74 times $C_d$; or if x is as large as 2.9, a figure of merit greater than two can still be obtained by making $C_s$ 24 times $C_d$ and $C_o$ 27 times $C_d$. The optimal parameter values give a figure of merit greater than 2.15, but no prior art peripherals give a figure of merit greater than one. The optimization of these parameters, for a given set of corresponding constraints, will now be discussed in detail.

Figure 2:
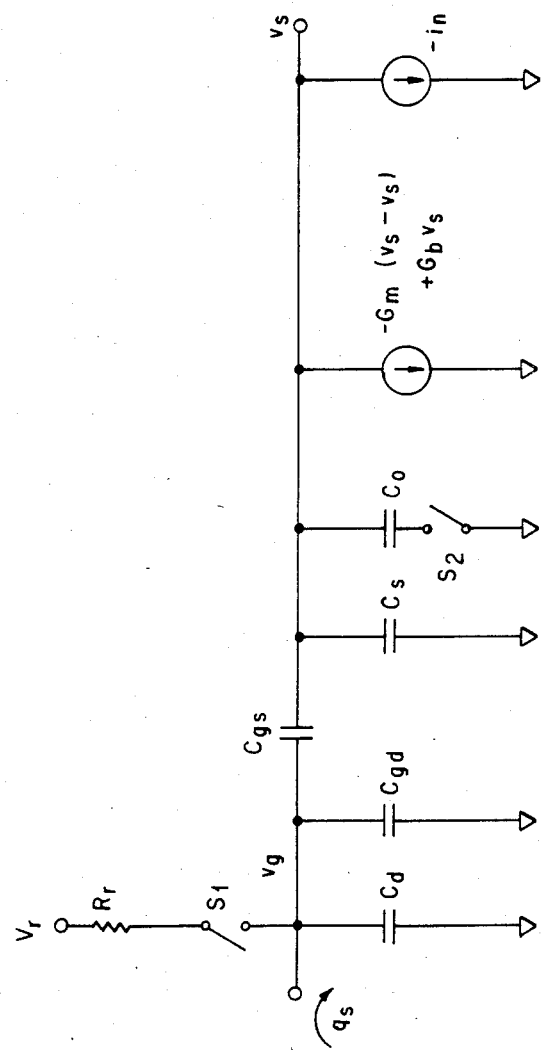
FIG. 2 shows a small signal equivalent circuit diagram for the first stage of the charge detection amplifier.

In the circuit of FIG. 1A, the parameters that will be optimized are the size of the transistor Q1 and the values for the capacitors $C_s$ and $C_o$. It will be assumed that the input capacitance of Q3 and capacitance of detection node 2 can be neglected relative to $C_o$ and $C_s$. Furthermore it will be assumed that the on-resistance of the reset transistor in the detection node 2 is small in comparison to the output resistance of Q1. Finally, it will be assumed that the sampling noise on the holding capacitor $C_h$ can be treated independently from the rest of the circuit and that the transistors Q3 and Q7 are large enough in order not to contribute significantly to the overall noise of the amplifier. With these assumptions in mind it is sufficient to focus attention only on the first stage of the amplifier and derive a small signal equivalent circuit diagram can be used for further analysis. The diagram is shown in FIG. 2.

Operation and Timing

The operation of an amplifier configuration such as that shown in FIG. 1A will now be discussed in detail.

The circuit configuration of FIG. 1A is controlled by three clock phases as shown in FIG. 1B. These clock pulses are shown as having zero lag, but some spacing between the pulses (shown approximately, in the dashed additions to the clock pulse curves, as a spacing delta) is allowable. That is, the falling edge of the reset pulse need not exactly coincide with the rising edge of the clamp pulse, as shown. A small delay delta is permissible, and can in fact be advantageous, since it reduces pulse feedthrough.

These phases are preferably not commonly wired in the three amplifiers. That is, one amplifier such as shown in FIG. 1A is connected to the end of each of the three serial shift registers. The shift registers themselves can be used to provide all the clocking signals for all three amplifiers, as shown in the following table. That is, the first amplifier will have its clamp phase wired to its own shift register, but will have its sample phase wired to the second shift register and its reset phase wired to the third shift register. Similarly, the second amplifier will have its clamp phase wired to the second shift register, but will have its sample phase wired to the third register and its reset phase wired to the first shift register, and the third amplifier will have its sample phase wired to the first shift register and its reset phase wired to the second shift register.

TABLE 1

| AMPLIFIER-REGISTER INTERCONNECTIONS | | | |
|---|---|---|---|
| | FUNCTION | | |
| Amplifier | CLAMP | SAMPLE | RESET |
| amp 1 | $\phi_{s1}$ | $\phi_{s2}$ | $\phi_{s3}$ |
| amp 2 | $\phi_{s2}$ | $\phi_{s3}$ | $\phi_{s1}$ |
| amp 3 | $\phi_{s3}$ | $\phi_{s1}$ | $\phi_{s2}$ |

This interconnection of the amplifiers provides economy in wiring, and also provides sequential phase in the three off-chip outputs, which is convenient for subsequent video signal processing.

One side effect of using common lines to control the serial region clocking and the clocking of the amplifier is that the serial register now sees asymmetrical timing. As is well known in the art, the optimal timing to enhance charge transfer efficiency of CCD structures is normally 50% clocking, i.e., 50% of the total time is spent in the high state and 50% in the low state. However, as may be seen from the clocking shown in FIG. 1B, the shared clocking used in the presently preferred embodiment means that at most the serial registers see clocking which is one-third on and two-thirds off. Moreover, if a slight delay is introduced between the clock phases, to reduce clock feedthrough (which is desirable for best amplifier control), the serial registers may see a timing which is closer to one-quarter on and three-quarters off.

Such asymmetrical timing would mean, with a conventional CCD structure, that the timing would have to be operated far below the maximum clocking frequency of the CCD structure, or else charge transfer efficiency would be greatly degraded.

However, the present invention preferably modifies the structure of the CCD elements in the serial registers to accomodate this asymmetrical timing. As may be seen in FIG. 5, the virtual barriers 118 are substantially wider than the virtual wells 34. This is quite different from the usual structure, where (as seen in FIG. 3, for example) the barriers are rather narrower than the wells. However, this asymmetrical structure in the serial clocking path cooperates with the asymmetrical clock timing imposed by the use of the serial register clocks to control the amplifier, since carriers can diffuse through the wide flat potential of barrier 118 during the long off portion of the clock pulse.

This asymmetrical structure achieves good charge transfer efficiency, while avoiding any need for additional implants to achieve more than two potential levels within a given clock phase.

FIGS. 14A, 14B, 14C, 15A, 15B, 15C, 16A, 16B, 16C, 17A, 17B, and 17C show the presently preferred layout of critical portions of the amplifier. These figures are overlays showing the mask layout: FIGS. 14A, 15A, 16A, and 17A show the moat 502, source/drain 504, poly 510, and the patterned channel stop 512 levels; FIGS. 14B, 15B, 16B, and 17B show the moat 502, source/drain 504, patterned channel implant 506 (which is performed before the patterned channel stop implant 512), and As-well (clocked well) 508 levels; FIGS. 14C, 15C, 16C, and 17C show the moat 502, source/drain 504, virtual well 514, virtual phase electrode (boron) 516, contacts 518, and metal 520 levels. These figures all adjoin each other; left to right, the order is FIG. 14, FIG. 15, FIG. 16, and FIG. 17.

While this particular layout is certainly not necessary to practising the present invention, it does illustrate several innovative features. These layouts, and the other mask patterns shown, are copyrighted 1985 by Texas Instruments Inc.; they contain proprietary information, and may not be used without the consent of Texas Instruments Inc.

FIG. 14 shows transistor Q1, capacitor $C_o$ and capacitor $C_s$. First detection node 216 and clock line $\phi_{RS}$ are not shown, nor are the serial shift registers to which these elements are connected. FIG. 15 shows the right side of capacitor $C_o$, as well as transistor Q2 and second detection node 232 with its reset gate 230, and transistors Q3 and Q5. FIG. 16 shows JFET load Q4, and large capacitor $C_h$. FIG. 17 shows surface channel output transistor Q7. Output JFET load Q6 is not shown (since it is preferably located near the contact pads, which are also not shown), but it is like Q4, only larger. Note that surface-channel MOSFET Q7 has its channel exposed to the SCHST implant, which the buried-channel devices (such as Q1) do not. Note also that both types have their gate regions exposed to the virtual well implant, to provide LDD extension regions which are self-aligned to their gates.

In addition, dummy crossovers are preferably included to balance the RC time constants of the three control lines used to control clocking of the three amplifiers. That is, the configuration of the amplifier clocking requires that the metal clock lines cross each at some points, which is accomplished by contacting one of the clock lines to a short strip of polysilicon to cross under the other metal line; in this feature of the present invention, dummy crossovers (short poly lines in series with the metal lines) are preferably wired in series in some of the clock lines to balance the additional RC delay introduced by the poly strips in others of the clock lines.

The output $V_{out}$ of the third source follower stage can be used to drive an off-chip line for subsequent stages, such as an NTSC encoder. However, the most difficult and critical processing stages have now been performed on chip, and the subsequent off chip processing is greatly simplified.

Of course, substantial advantages can be obtained even if not all of these stages are integrated on chip. For example, the sample and hold stage of Q5, $C_h$, Q7, and Q6 could be moved off chip, so that the output of transistor Q3 would be used to drive the off chip line. This embodiment is slightly less preferable, but still derives advantage from significant innovative features of the invention. In particular, the advantages of having a reset resistance in the reset path to first detection node 216 are retained; as are the advantages derived from correct relative sizing of transistor Q1 and capacitors $C_o$ and $C_s$ relative to the size of the detection node 216; as are the advantages of having a dummy CCD structure 233, connected to a second detection node 232, on chip; as are the advantages of having reset gates (in a color device) cross-coupled to serial shift register gates.

It is significantly less preferable to move the entire detection node structure 233 off chip (i.e. use the output of Q1 to drive a line off chip), but even this structure still permits advantageous use of a reset resistance in the reset path to first detection node 216.

Figure 7:
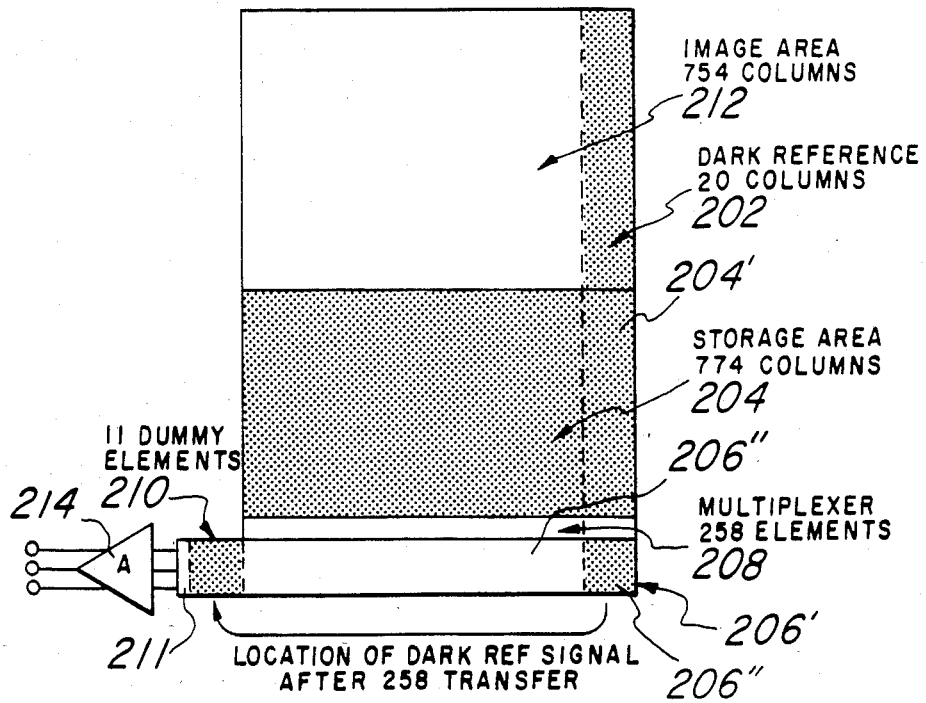
FIG. 7 show the relative locations of serial shift registers 206, multiplexer 208, and dummy elements 210 (in which the dark reference signal generated at the right edge of the image sensing area is stored during horizontal blanking interval), together with the image area 212.

The array clocking preferably used can now be discussed with reference to FIG. 7. An image area 212 is exposed to an aerial image, and allowed to collect charge for a desired length of time. Meanwhile, the dark reference CCD elements in area 202 collect whatever charge may be contributed by dark currents. The dark reference columns in area 202 have the same configuration as those in the image area 212, except that the ones in dark reference area 202 are covered by a metal shield so that light does not reach them.

At every vertical frame transfer interval, the gate lines of both image area 212 and storage area 204 are clocked repeatedly, until the entire image has been transferred from image area 212 into storage area 204. After this, the storage area 204 is clocked one line at a time. After each line from storage area 204 is transferred through multiplexer 208 into the three shift registers 206, the shift registers 206 are clocked to transfer these charge packets through output amplifiers 214.

Note that in the foregoing operations, the dark reference columns 202 at the edge of the image area 212 have been transferred through portion 204' of the storage area 204 into the six or seven elements (the area 206') at the end of the three shift registers 206 which is farthest from the output amps 204.

After each line of charge packets has been transferred into the serial registers 206, the shift registers are clocked to move the pixel signals along shift registers 206, through dummy elements 210, and into the charge detection node area 211. However, according to the present invention, after all of the pixel image charges from image area 212, which are now held in serial register 206", have been clocked through charge sensing nodes 211, the dark reference signals, which originated in dark reference area 202 and came into the serial shift registers in area 206', are preferably not clocked through the detection nodes 211, but are left in the dummy elements 210. Thus, when the next line transfer occurs, the dark reference information is already in the dummy elements 210, and is therefore clocked through detection nodes 211 and 214 first.

The information from dark reference pixels 202 is not processed on-chip, but provides useful information for offset and noise level estimation for off-chip amplifiers. However, if the dark reference information is clocked into the leading edge of the serial registers, as in the prior art, the delay imposed by the dark reference pixels plus the dummy elements necessary to separate the amplifiers 214 from the CCD array, will be excessive. To put this in another way, the various standard TV formats all have predetermined limits on the amount of time available for horizontal blanking. By combining the delay necessary for dummy elements 210 with the delay necessary for dark reference signals 206', the present invention permits the predetermined time limit to be satisfied without having to curtail the number of dummy elements 210, or attempt to use non standard clock rates in the serial shift registers 206, or curtail the time permitted for parallel transfer and multiplexing operations, or otherwise undesirably constrain the design.

Thus, the foregoing system permits CCD imagers to provide a fully NTSC-compatible (or PAL or SECAMcompatible) output timing. The vertical blanking intervals are used to transfer the entire image in parallel from image area 212 to storage area 204, and the horizontal blanking intervals are used to transfer one line of pixels in parallel from storage area 204 through multiplexer 208 into the three shift registers 206.

As will be recognized by those skilled in the art, the present patent application teaches numerous broadly applicable concepts in CCDs. These concepts may be embodied in a tremendous variety of device, processing, and system embodiments, and the scope of the present invention is accordingly not limited except as specified in the claims.

What is claimed is:

1. A CCD structure comprising:
   a chain of CCD wells;
   a first charge-sensing node coupled to one end of said chain of CCD wells;
   clocking means for clocking charge packets from said end of said chain of CCD wells into said first charge-sensing node;
   a buffer amplifier connected to sense the voltage on said first charge-sensing node;
   a dummy charge-sensing node integrated in a common body of monocrystalline semiconductor material with said first charge-sensing node;
   said first charge-sensing node and said dummy charge-sensing node being operatively connected to a common reference voltage;
   and means for sensing the voltage change on said first charge-sensing node after a charge packet has been transferred into said first charge-sensing node with reference to the voltage on said dummy node.

2. A CCD structure comprising:
   a chain of CCD wells;
   a charge-sensing node coupled to one end of said chain of CCD wells;
   clocking means for clocking charge packets from said end of said chain of CCD wells into said charge-sensing node;
   and a correlated-clamp-sample-and-hold amplifier, integrated in a common body of monocrystalline semiconductor material with said CCD wells, comprising
      a buffer amplifier connected to sense the voltage on said charge-sensing node,
      reset means for resetting said charge-sensing node to a predetermined potential,
      a first coupling capacitance Co connecting the output of said first buffer amplifier to the input of a second buffer amplifier,
      a second coupling capacitance Cs connecting the output of said first buffer amplifier to ground,
         a dummy charge-sensing node connected to said input of said second buffer amplifier,
         and a third buffer amplifier operatively conected to the output of said second buffer amplifier.

3. The CCD structure of claim 2, wherein said second and third buffer amplifiers are separated by a
   means for sampling the output of said second buffer amplifier,
   the input of said third amplifier being connected to receive a sampled output from said second amplifier.

4. The CCD structure of claim 2, wherein said first and second buffer amplifiers each comprise a source follower.

5. The CCD structure of claim 2, wherein said first and second buffer amplifiers each comprise a FET, said FET having a gate to which said input is connected and also having a source connected to a load element, said load element comprising a JFET.

6. The CCD structure of claim 5, wherein said JFET load of said first buffer amplifier has a width to length ratio which is much less than one.

* * * * *